United States Patent
Lopatin et al.

(10) Patent No.: US 6,528,409 B1
(45) Date of Patent: Mar. 4, 2003

(54) INTERCONNECT STRUCTURE FORMED IN POROUS DIELECTRIC MATERIAL WITH MINIMIZED DEGRADATION AND ELECTROMIGRATION

(75) Inventors: Sergey Lopatin, Santa Clara, CA (US); Fei Wang, San Jose, CA (US); Diana Schonauer, San Jose, CA (US); Steven C. Avanzino, Cupertino, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/134,883

(22) Filed: Apr. 29, 2002

(51) Int. Cl.[7] .......................................... H01L 21/4763
(52) U.S. Cl. ...................... 438/618; 438/627; 438/629; 438/648; 438/653; 438/672; 438/675; 438/687
(58) Field of Search ................................. 438/618–620, 438/622–687

(56) References Cited

U.S. PATENT DOCUMENTS

| | | | |
|---|---|---|---|
| 5,695,810 A | 12/1997 | Dubin et al. .................. 427/96 |
| 5,962,923 A | * 10/1999 | Xu et al. ..................... 257/774 |
| 6,083,842 A | 7/2000 | Cheung et al. ............. 438/706 |
| 6,144,096 A | 11/2000 | Lopatin ....................... 257/751 |
| 6,144,099 A | 11/2000 | Lopatin et al. ............. 257/758 |
| 6,259,160 B1 | 7/2001 | Lopatin et al. ............. 257/762 |
| 6,323,128 B1 | 11/2001 | Sambucetti et al. ........ 438/678 |
| 6,413,383 B1 | * 7/2002 | Chiang et al. ......... 204/192.13 |

OTHER PUBLICATIONS

A. Kohn et al., *Characterization of Electroless Deposited Co(W,P) Thin Films for Encapsulation of Copper Metallization*, Materials Science and Engineering, A302, 2001, pp. 18–25.

A. Kohn et al., *Evaluation of Electroless Deposited Co(W,P) Thin Films as Diffusion Barriers for Copper Metallization*, Microelectronics Engineering, 55, 2001, pp. 297–303.

Yosi Shacham–Diamand and Sergey Lopatin, *Integrated Electroless Metallization for ULSI*, Electrochimica Acta, 44, 1999, pp. 3639–3649.

(List continued on next page.)

*Primary Examiner*—Jey Tsai
(74) *Attorney, Agent, or Firm*—Monica H. Choi

(57) ABSTRACT

For fabricating an interconnect structure within an interconnect opening formed within a porous dielectric material, the interconnect opening is initially formed within a low-K precursor material that is not completely cured. The interconnect opening is then filled with a conductive fill material being contained within the interconnect opening and with a top surface of the conductive fill material within the interconnect opening being exposed. A capping material is formed on the top surface of the conductive fill material, and the capping material is an amorphous alloy or is a microcrystalline alloy having stuffed grain boundaries. A thermal curing process is then performed for curing the low-K precursor material to become a porous low-K dielectric material. The capping material on the top surface of the conductive fill material is impervious to at least one of oxygen, carbon, hydrogen, chlorine, and porogen fragments that are generated as out-gassing volatile by-products from the low-K precursor material during the thermal curing process to preserve the integrity of the interconnect structure. In another aspect for fabricating an interconnect structure, an interconnect opening is formed within a porous dielectric material with opened pores at sidewalls of the interconnect opening. A diffusion barrier material is formed at a bottom wall of the interconnect opening. The diffusion barrier material is then sputtered away from the bottom wall of the interconnect opening and onto the sidewalls of the interconnect opening to substantially fill the opened pores at the sidewalls with the diffusion barrier material. The interconnect opening is then filled with a conductive fill material after the opened pores at the sidewalls of the interconnect opening are filled with the diffusion barrier material.

67 Claims, 20 Drawing Sheets

OTHER PUBLICATIONS

Yosi Shacham–Diamand and Sergey Lopatin, *High Aspect Ratio Quarter–Micron Electroless Copper Integrated Technology*, Microelectronics Engineering, 37/38, 1997, pp. 77–88.

S. Lopatin et al., *Integration of Electroless Cu and CoWP Multilayers in Damascene Process*, ELectrochemical Society Proceedings, vol. 97–8, 1997, pp. 186–195.

S. Lopatin et al., *Electroless CoWP Barrier/Protection Layer Deposition for Cu Metallization*, Mat. Res. Soc. Symp. Proc., vol. 451, Materials Research Society, 1997, pp. 463–468.

S. Lopatin et al., *Selective Electroless CoWP Deposition onto Pd–Activated In–Laid Cu Line*, VMIC Conference, Jun. 10–12 1997, pp. 219–224.

S. Lopatin et al., *Electroless Cu and Barrier Layers for Sub–Half Micron Multilevel Inteconnects*, SPIE vol. 3214, 1997, pp. 21–32.

Cecilia Y. Mark, *Electroless Copper Deposition on Metals and Metal Silicides*, MRS Bulletin, Aug. 1994, pp. 55–62.

U.S. patent application Ser. No. 10/017,886, to Steven C. Avanzino et al., filed Dec. 13, 2001, *Process for Formation of a Wiring Network using a Porous Interlevel Dielectric and Related Structures*.

J.S.H. Cho et al., *Copper Interconnection with Tungsten Cladding for ULSI*, VLSI Tech. Symp., 1991, pp. 39–40.

Donald S. Gardner et al., *Encapsulated Copper Interconnection Devices using Sidewall Barriers*, VMIC Conference, Jun. 11–12, 1991, pp. 99–108.

Roger Palmans et al., *Development of an Electroless Copper Deposition Bath for Via Fill Applications on TiN Seed Layers*, Conf. Proc. ULSI–X, Materials Research Society, 1995, pp. 87–94.

V. Dubin et al., *Selective and Blanket Electroless Cu Plating Initiated by Contact Displacement for Deep Submicron Via Contact Filling*, VMIC Conference, Jun. 27–29 1995, pp. 315–321.

* cited by examiner

INTERCONNECT STRUCTURE FORMED IN POROUS DIELECTRIC MATERIAL WITH MINIMIZED DEGRADATION AND ELECTROMIGRATION

TECHNICAL FIELD

The present invention relates generally to fabrication of interconnect structures within integrated circuits, and more particularly, to minimizing electromigration failure and degradation of an interconnect structure formed in porous low-K dielectric material.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and extruded metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

Referring to FIG. 1, a cross sectional view is shown of a copper interconnect 102 within a trench 104 formed in an insulating layer 106. The copper interconnect 102 within the insulating layer 106 is formed on a dense dielectric material 109 deposited on a semiconductor wafer 108 such as a silicon substrate as part of an integrated circuit. The dense dielectric material 109 may be a hardmask layer, an etch stop layer, or a capping layer comprised of $SiO_2$ (silicon dioxide) or SiN (silicon nitride) for example. Because copper is not a volatile metal, copper cannot be easily etched away in a deposition and etching process as typically used for aluminum metallization. Thus, the copper interconnect 102 is typically formed by etching the trench 104 as an opening within the insulating layer 106, and the trench 104 is then filled with copper typically by an electroplating process, as known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 1, the insulating layer 106 may be comprised of silicon dioxide or a low dielectric constant insulating material such as organic doped silica, as known to one of ordinary skill in the art of integrated circuit fabrication. The low dielectric constant insulating material has a dielectric constant that is lower than that of pure silicon dioxide ($SiO_2$) for lower capacitance of the interconnect, as known to one of ordinary skill in the art of integrated circuit fabrication.

Copper may easily diffuse into such an insulating layer 106, and this diffusion of copper may degrade the performance of the integrated circuit. Thus, a diffusion barrier material 110 is deposited to surround the copper interconnect 102 within the insulating layer 106 on the sidewalls and the bottom wall of the copper interconnect 102, as known to one of ordinary skill in the art of integrated circuit fabrication. The diffusion barrier material 110 is disposed between the copper interconnect 102 and the insulating layer 106 for preventing diffusion of copper from the copper interconnect 102 to the insulating layer 106 to preserve the integrity of the insulating layer 106.

Further referring to FIG. 1, an encapsulating layer 112 is deposited as a passivation layer to encapsulate the copper interconnect 102, as known to one of ordinary skill in the art of integrated circuit fabrication. The encapsulating layer 112 is typically comprised of a dielectric such as silicon nitride, and copper from the copper interconnect 102 does not easily diffuse into such a dielectric of the encapsulating layer 112.

As the density of integrated circuit structures continually increases, the distance between the interconnect structures decreases. As the distance between the interconnect structures decreases, a dielectric material with a low dielectric constant (i.e., a low-K dielectric material) is desired for the insulating layer 106. The insulating layer 106 being comprised of the dielectric material with a low dielectric constant results in lower capacitance between the interconnect structures. Such lower capacitance results in higher speed performance of the integrated circuit and also in lower power dissipation. In addition, such lower capacitance results in lower cross-talk between the interconnect structures. Lower cross-talk between interconnect structures is especially advantageous when the interconnect structures are disposed closer together as device density continually increases.

Referring to FIG. 2, one example of a dielectric material with a low dielectric constant for the insulating layer 106 is a porous dielectric material having pores throughout as known to one of ordinary skill in the art of integrated circuit fabrication. An interconnect opening 116 is formed within the porous dielectric material of the insulating layer 106 for forming an interconnect structure within the interconnect opening 116. With the porous dielectric material for the insulating layer, the interconnect opening 106 has opened pores 118 at the sidewalls of the interconnect opening 116.

Referring to FIG. 3, in the prior art, as device dimensions continually decrease, a diffusion barrier material 120 that is as thin as possible is deposited on the sidewalls and the bottom wall of the interconnect opening 116. The diffusion barrier material 120 of FIG. 3 is similar to the diffusion barrier material 110 of FIG. 1. Because diffusion barrier materials generally have higher resistance than copper, the diffusion barrier material 120 in the prior art is deposited as thin as possible to minimize resistance of the interconnect structure formed within the interconnect opening 116.

However, the pores 114 of the insulating layer 106 range in size with the pores 114 having a mean diameter in a range of from about 10 Å (angstroms) to about 200 Å (angstroms), depending on the type of low-K dielectric material of the insulating layer 106. For example, for OSG (organic spin-on glass), the diameter of the pores are in a range of from about 10 Å (angstroms) to about 40 Å (angstroms) with the mean diameter being about 25 Å (angstroms). On the other hand, for hydrocarbon polymer material, the diameter of the pores are in a higher range being as high as 200 Å (angstroms).

A thin diffusion barrier material 120 that is deposited in a conformal deposition process of the prior art does not completely fill such opened pores 118 at the sidewalls of the interconnect opening 116. Further referring to FIG. 3, when the diffusion barrier material 120 does not completely fill such opened pores 118 at the sidewalls of the interconnect opening 116, a seed layer of copper 122 that is deposited onto the diffusion barrier material 120 does not reach into the opened pores 118 at the sidewalls of the interconnect opening 116.

Referring to FIG. 4, when a copper conductive fill 124 is grown from the copper seed layer 122 for filling the interconnect opening 116, voids 126 are formed from the opened pores 118 at the sidewalls of the interconnect opening 116 because the opened pores 118 do not have the copper seed layer 122 deposited therein. Such voids 126 disadvantageously increase the probability of electromigration failure of the interconnect structure.

Nevertheless, use of porous dielectric material for the insulating layer 106 is desired for the low dielectric constant. Accordingly, a mechanism is desired for preventing formation of voids from opened pores at the sidewalls of the interconnect opening formed within the porous dielectric material.

In addition, one type of porous low-K dielectric material is formed from a low-K precursor material comprised of a thermosetting host material and a thermally degradable "porogen" material, as known to one of ordinary skill in the art of integrated circuit fabrication. In that case, a solution of the low-K precursor material is applied by a spin-on process, and then a thermal process is performed for "curing" the low-K precursor material to the porous low-K dielectric material. The thermal process causes curing of the low-K precursor material with cross-linking of the host material to form a low-K dielectric matrix and concurrently with phase separation of the porogen from the host material. The phase separated porogen collects in nanoscopic domains within the host material and thermally decomposes into volatile by-products (i.e., porogen fragments) that diffuse out of the low-K dielectric material leaving pores in their place. Dow Chemical's porous SILK product and JSR Corporation's JSR 5109 product are examples of commercially available precursors that utilize an organic host material. Such formation of low-K porous dielectric material by curing low-K precursor material in a thermal curing process is known to one of ordinary skill in the art of integrated circuit fabrication.

However, the porogen fragments that diffuse out during the thermal process of curing the low-K dielectric material may contain carbon, oxygen, chlorine, and/or hydrogen and compounds of such elements that degrade copper interconnect upon contact with the copper interconnect. Thus, a mechanism is desired for preventing contact of the porogen fragments with a surface of copper interconnect structure.

SUMMARY OF THE INVENTION

Accordingly, in a general aspect of the present invention, an interconnect opening is formed in a low-K precursor material that is not completely cured such that no significant pores are opened at sidewalls of the interconnect opening when filling the interconnect opening with conductive fill material. In addition, a capping material comprised of an amorphous alloy or a microcrystalline alloy having stuffed grain boundaries is formed on the conductive fill material before a thermal curing process for curing the low-K precursor dielectric material to become the porous low-K dielectric material.

In a general aspect of the present invention, for fabricating an interconnect structure within an interconnect opening formed within a porous dielectric material, the interconnect opening is initially formed within a low-K precursor material that is not completely cured. The interconnect opening is then filled with a conductive fill material being contained within the interconnect opening and with a top surface of the conductive fill material within the interconnect opening being exposed. A capping material is formed on the top surface of the conductive fill material, and the capping material is an amorphous alloy or is a microcrystalline alloy having stuffed grain boundaries. A thermal curing process is then performed for curing the low-K precursor material to become a porous low-K dielectric material. The capping material on the top surface of the conductive fill material is impervious to at least one of oxygen, carbon, hydrogen, chlorine, and porogen fragments that are generated as outgassing volatile by-products from the low-K precursor material during the thermal curing process.

In another embodiment of the present invention, a diffusion barrier material is also formed at the sidewalls of the interconnect opening between the conductive fill material and the low-K precursor material that is not completely cured. In that case, the capping material is selectively formed on any exposed surface of the conductive fill material and the diffusion barrier material before the thermal curing process.

In a further embodiment of the present invention, an activation layer is formed before the capping material is formed on the activation layer for enhancing adhesion of the capping material to the conductive fill material.

The present invention may be used to particular advantage for forming an interconnect structure within the interconnect opening that is one of a metal line, a via hole, or a dual damascene opening.

In this manner, because the interconnect opening is formed and filled within the low-K precursor material that is not completely cured, the sidewalls of such an interconnect opening do not have any significantly sized opened pores during filling of the interconnect opening. Thus, formation of voids, and in turn, electromigration failure of the interconnect structure is minimized. In addition, the capping material that is an amorphous alloy or a microcrystalline alloy having stuffed grain boundaries is impervious to at least one of oxygen, carbon, hydrogen, chlorine, and porogen fragments that are generated as out-gassing volatile by-products from the low-K precursor material during the thermal curing process. Since such a capping material encapsulates the top surface of the conductive fill material, such volatile by-products of the low-K precursor material do not contact the conductive fill material to preserve the integrity of the conductive fill material during curing of the low-K precursor material to form the porous low-K dielectric material.

In another aspect of the present invention, for fabricating an interconnect structure, an interconnect opening is formed within a porous dielectric material with opened pores at sidewalls of the interconnect opening. A diffusion barrier material is formed at a bottom wall of the interconnect opening. The diffusion barrier material is then sputtered away from the bottom wall of the interconnect opening and onto the sidewalls of the interconnect opening to substantially fill the opened pores at the sidewalls with the diffusion barrier material. The interconnect opening is then filled with a conductive fill material after the opened pores at the sidewalls of the interconnect opening are filled with the diffusion barrier material.

In one embodiment of the present invention, the diffusion barrier material is deposited onto the bottom wall of the interconnect opening in an electroless deposition process after the interconnect opening is formed. In another embodiment of the present invention, the diffusion barrier material is formed onto a conductive material of a bottom interconnect structure, and then the porous dielectric material and the interconnect opening are formed over the diffusion barrier material such that the diffusion barrier material forms the bottom wall of the interconnect opening.

In this manner, because the interconnect opening is filled with the conductive fill material after the opened pores at the sidewalls of the interconnect opening are filled with the diffusion barrier material, void formation from the opened pores are minimized to in turn minimize electromigration failure of the interconnect structure.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5, 6,7,8,9,10,11,12,13,14,15,16,17,18,19,20,21,22,23,24,25, 26,27,28,29,30,31, 32,33,34,35,36,37,38,39,40,41,42,43,44, and 45 refer to elements having similar structure and function.

DETAILED DESCRIPTION

The present invention is described for formation of copper interconnect. However, the present invention may be practiced for minimizing electromigration failure and degradation of other types of interconnects, as would be apparent to one of ordinary skill in the art of integrated circuit fabrication from the description herein.

Figure 1:
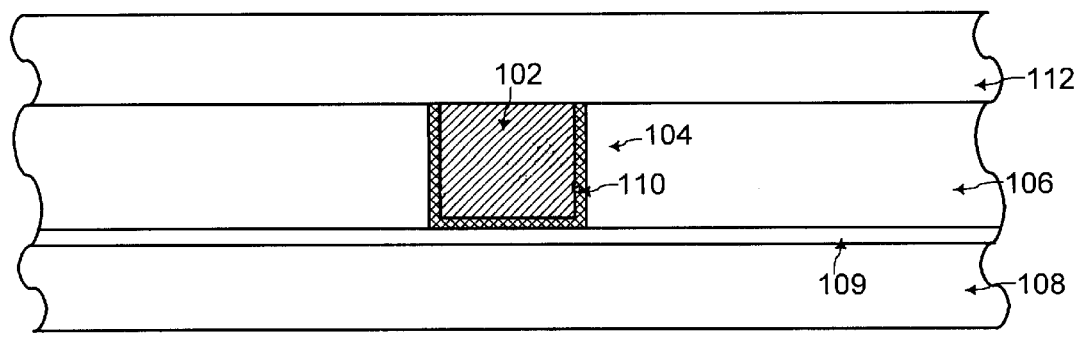
FIG. 1 shows a cross-sectional view of a copper interconnect formed by copper filling a trench within an insulating layer, according to the prior art.
Figure 2:
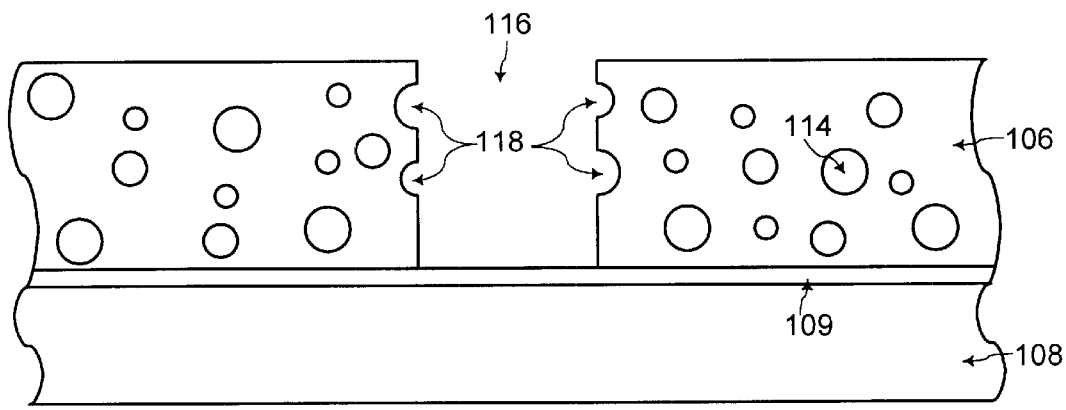
FIG. 2 shows a cross-sectional view of a porous dielectric material being used for the insulating layer surrounding the interconnect opening for forming the copper interconnect of FIG. 1.
Figure 3:
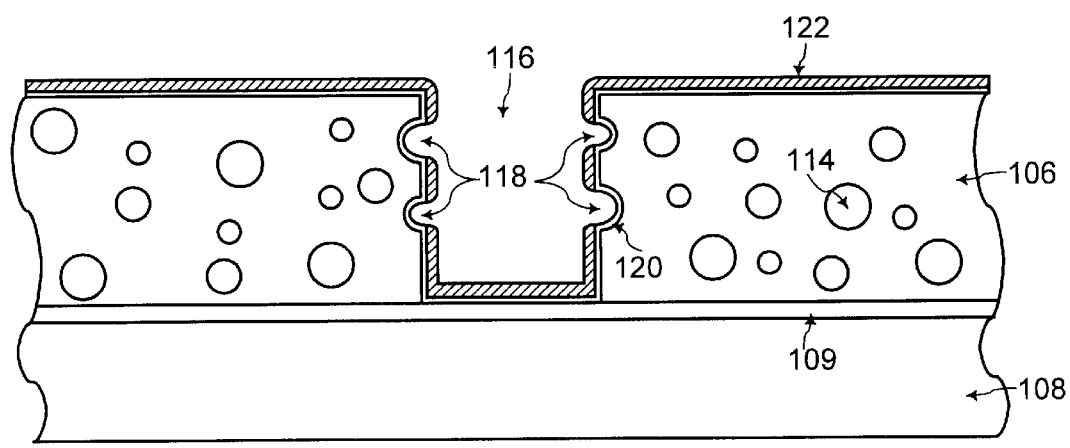
FIG. 3 shows a cross-sectional view of a thin diffusion barrier material being deposited without completely filling the opened pores at the sidewalls of the interconnect opening of FIG. 2, according to the prior art.
Figure 4:
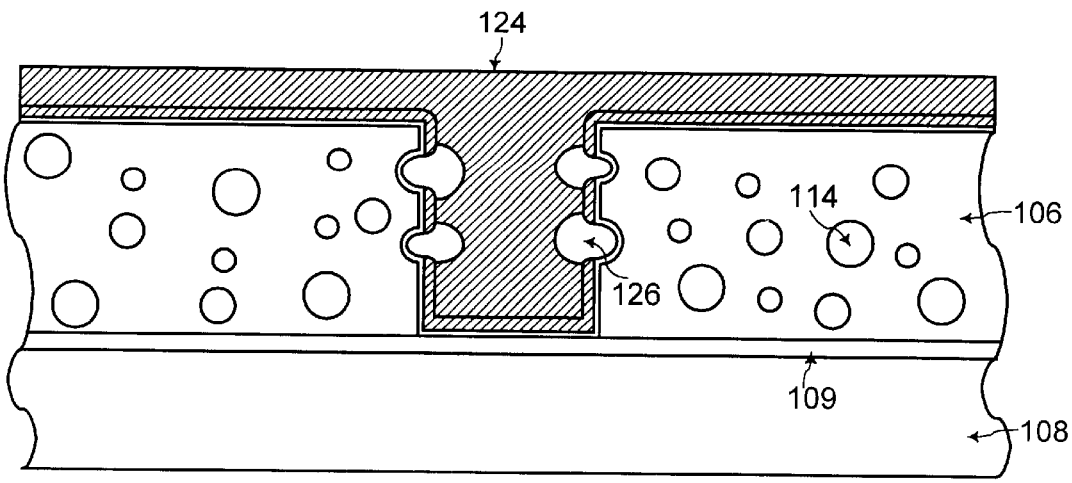
FIG. 4 shows a cross-sectional view of an interconnect structure with void formation when the opened pores at the sidewalls of the interconnect opening are not completely filled, according to the prior art.
Figure 6:
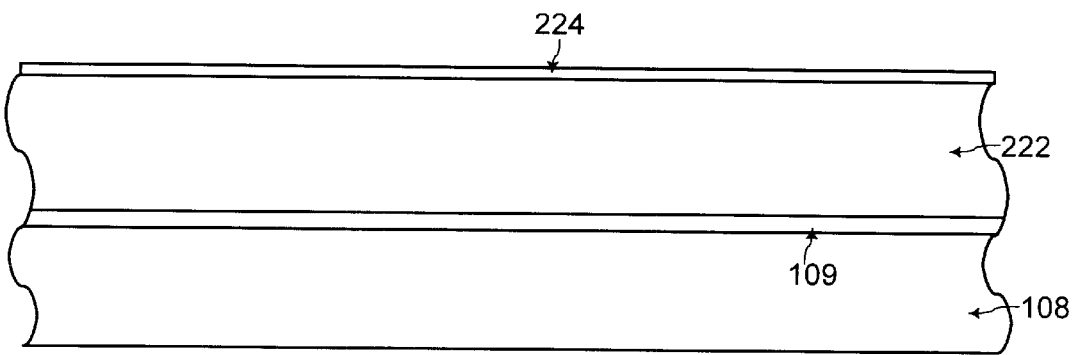
FIGS. 6, 7, 8, 9, 10, 11, 12, and 13 show cross-sectional views for forming an interconnect structure within an interconnect opening that is a metal line in porous low-K dielectric material, with minimized electromigration failure and degradation of the interconnect structure following the flow-chart of FIG. 5, according to an embodiment of the present invention.
Figure 5:
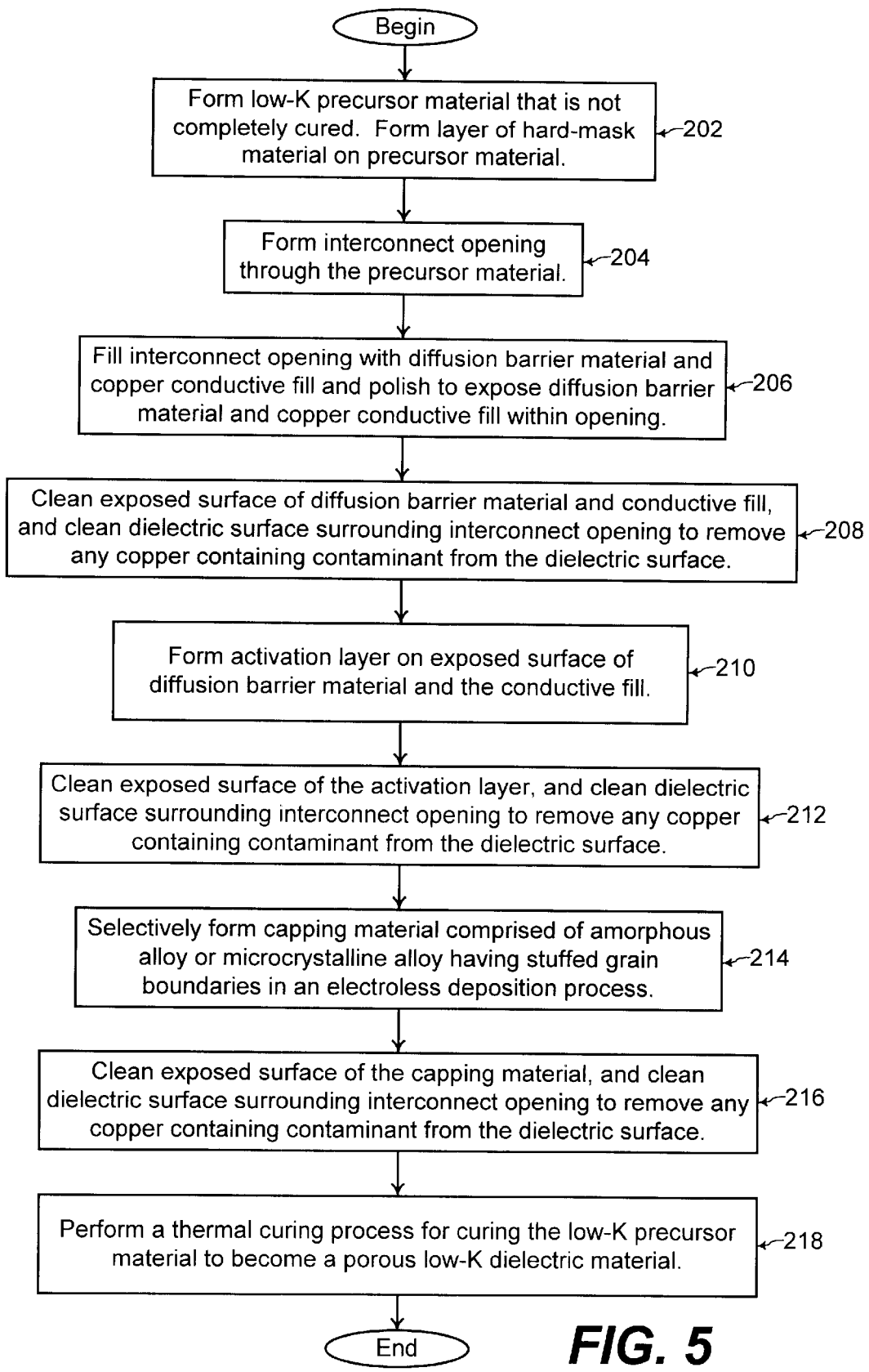
FIG. 5 shows a flow-chart of steps for forming an interconnect structure in porous low-K dielectric material with minimized electromigration failure and degradation of the interconnect structure, according to one embodiment of the present invention.

FIG. 5 shows a flow-chart of steps for forming an interconnect structure within a porous dielectric material with minimized electromigration failure and degradation of the interconnect structure. Referring to FIGS. 5 and 6, a layer of low-K precursor material 222 is deposited onto the dense dielectric material 109 formed on the semiconductor wafer 108 such as a silicon substrate (step 202 of FIG. 5). The dense dielectric material 109 may be a hardmask layer, an etch stop layer, or a capping layer comprised of $SiO_2$ (silicon dioxide) or SiN (silicon nitride) for example.

The low-K precursor material 222 is comprised of a thermosetting host material and a thermally degradable "porogen" material that forms the porous low-K dielectric material after being cured in a thermal curing process, as known to one of ordinary skill in the art of integrated circuit fabrication. In one embodiment of the present invention, the low-K precursor material 222 is partially cured in a thermal process that heats up the low-K precursor material 222 for densifying the layer of the low-K precursor material 222. Partial thermal curing processes for densifying the low-K precursor material 222 are known to one of ordinary skill in the art of integrated circuit fabrication. The present invention may be practiced when the low-K precursor material 222 has been partially cured or has not been cured in any thermal process depending on the type of low-K precursor material 222. However, in any case, the low-K precursor material 222 is not completely cured such that the low-K precursor material 222 does not contain any significantly sized pores therein.

Further referring to FIG. 6, a layer of hard-mask dielectric material 224 is formed on the low-K precursor material 222 (step 202 of FIG. 5). The layer of hard-mask dielectric material 224 is comprised of alkoxysilane in one embodiment of the present invention. In that case, the layer of hard-mask dielectric material 224 comprised of alkoxysilane is transparent to carbon, oxygen, chlorine, and/or hydrogen and compounds of such elements forming porogen fragments that are the volatile by-products formed during later thermal curing of the low-K precursor material 222. Thus, such volatile by-products formed during later thermal curing of the low-K precursor material 222 readily diffuse out through the layer of hard-mask dielectric material 224 comprised of alkoxysilane. The present invention may be practiced with or without formation of the layer of hard-mask dielectric material 224 on the low-K precursor material 222.

Figure 7:
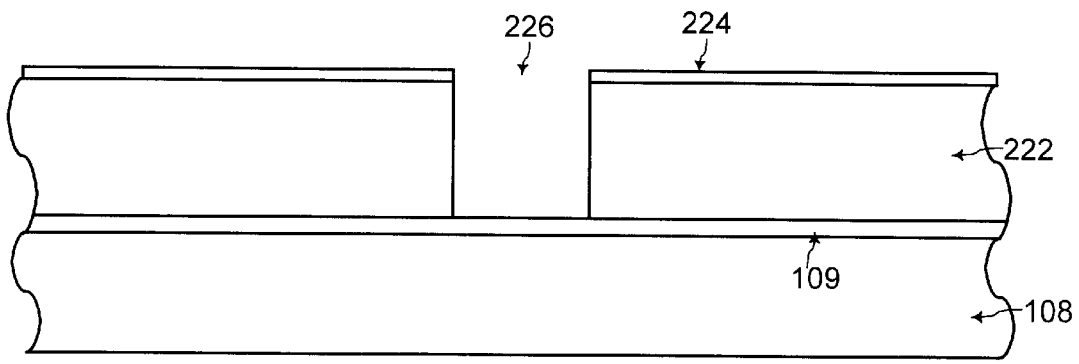

Referring to FIG. 7, an interconnect opening 226 is formed through the layer of hard-mask dielectric material 224 and the low-K precursor material 222 (step 204 of FIG. 5). Processes for patterning and etching the interconnect opening 226 through the layer of hard-mask dielectric material 224 and the low-K precursor material 222 that is not completely cured are known to one of ordinary skill in the art of integrated circuit fabrication.

Figure 8:
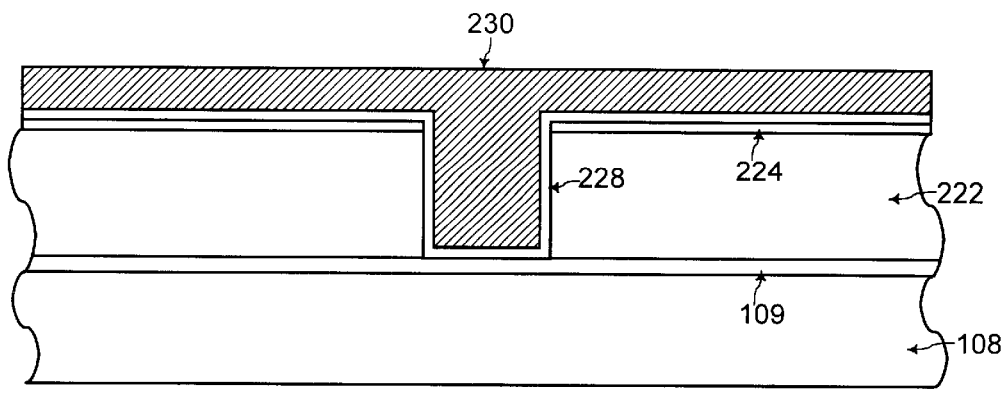

Referring to FIGS. 7 and 8, a diffusion barrier material 228 is conformally deposited to cover the sidewalls of the interconnect opening 226, and a conductive fill material 230 is then deposited to fill the interconnect opening 226 (step 206 of FIG. 5). In one embodiment of the present invention, the conductive fill material 230 is comprised of copper, and the diffusion barrier material 228, disposed between the conductive fill material 230 and the surrounding insulating materials 222 and 109, prevents diffusion of copper from the conductive fill material 230 into the surrounding insulating materials 109 and/or 222.

Such diffusion barrier materials and processes for deposition of such diffusion barrier materials are known to one of ordinary skill in the art of integrated circuit fabrication. For example, the diffusion barrier material 228 is comprised of one of WN (tungsten nitride) or TiSiN (titanium silicon nitride) deposited in an ALD (atomic layer deposition) process in one embodiment of the present invention. In addition, processes for forming the copper conductive fill material 230 for filling the interconnect opening 226 are known to one of ordinary skill in the art of integrated circuit fabrication.

Figure 9:
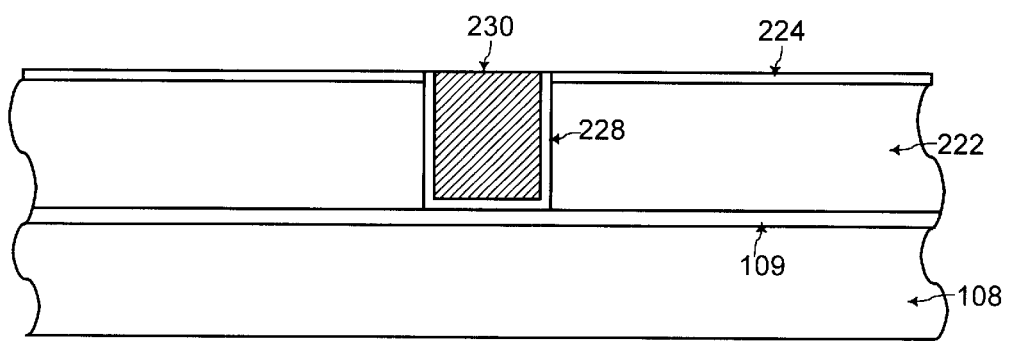

Referring to FIGS. 8 and 9, the portions of the conductive fill material 230 and the diffusion barrier material 228 on the layer of hard-mask dielectric material 224 are polished away such that the conductive fill material 230 and the diffusion barrier material 228 are contained within the interconnect opening 226 (step 206 of FIG. 5). Processes, such as CMP (chemical mechanical polishing) processes for polishing away the conductive fill material 230 and the diffusion barrier material 228 from the layer of hard-mask dielectric material 224 are known to one of ordinary skill in the art of integrated circuit fabrication.

After such a polishing process, a cleaning process is performed in one embodiment of the present invention (step 208 of FIG. 5). In such a cleaning process, the exposed top surface of the conductive fill material 230 and the diffusion barrier material 228 is wetted in $H_2O$ or in $H_2O$ with surfactant. Copper oxides, such as $Cu_2O$ or CuO for example, are etched away from the exposed top surface of the conductive fill material 230 and the diffusion barrier material 228 using one of a hydrochloric acid ($H_2O$ with HCl) solution or a sulfuric acid ($H_2O$ with $H_2SO_4$) solution. The exposed top surface of the conductive fill material 230 and the diffusion barrier material 228 is then rinsed in $H_2O$.

In addition, copper contaminants are removed from the exposed surface of hard-mask dielectric material 224 surrounding the conductive fill material 230 and the diffusion barrier material 228 (step 208 of FIG. 5). For that purpose, a rotating brush is applied on the exposed surface of hard-mask dielectric material 224, and a cleaning solution is applied on the exposed surface of hard-mask dielectric material 224 to clean away copper containing particles from the exposed surface of hard-mask dielectric material 224. In one embodiment, such a cleaning solution is comprised of one of the following: citric acid, 5-aminotetrazol, and water ($H_2O$); citric acid, benzotriazole (BTA), and water ($H_2O$); citric acid, polyvinyl alcohol (PVA), amidizole, and water ($H_2O$); or citric acid, polyvinyl alcohol (PVA), triethanolamine, and water ($H_2O$).

Such removal of copper containing particles from the exposed surface of the hard-mask dielectric material 224 is important for selective formation of a protective capping material substantially only on the exposed top surface of the conductive fill material 230 and the diffusion barrier material 228. If copper containing particles are present on the exposed surface of hard-mask dielectric material 224, then the capping material may also undesirably agglomerate around such copper containing particles on the exposed surface of hard-mask dielectric material 224.

Figure 10:
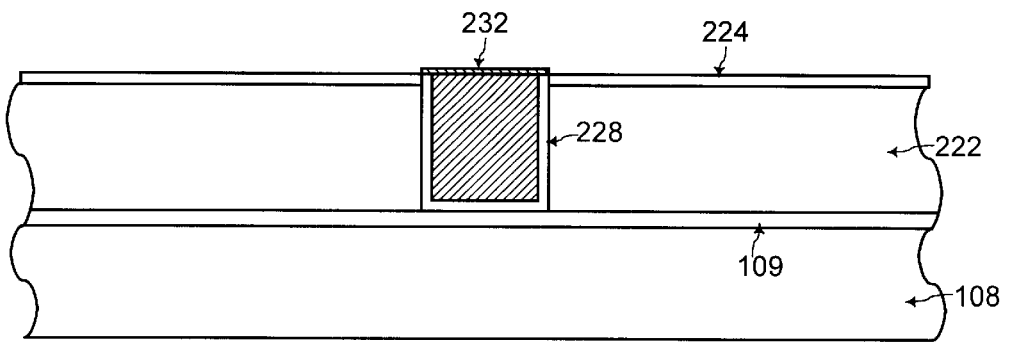

Referring to FIG. 10, an activation layer 232 is selectively formed on the exposed top surface of the conductive fill material 230 and the diffusion barrier material 228 (step 210 of FIG. 5). The activation layer 232 is comprised of one of Pd (palladium), Ag (silver), Co (cobalt), Ni (nickel), Zn (zinc), Pt (platinum), or Sn (tin), according to one embodiment of the present invention. In one embodiment of the present invention, the activation layer 232 comprised of palladium and having a thickness of from about 10 Å (angstroms) to about 50 Å (angstroms) is formed from an activation solution comprised of palladium ions, an acid, and water ($H_2O$). In an example embodiment, the activation solution may be comprised of: 0.1–2 milli-liter/liter of $PdCl_2$ (palladium chloride), 2–5 milli-liter/liter of HF (hydrofluoric acid), 1–5 milli-liter/liter of $HNO_3$ (nitric acid), and 1–30 milli-liter/liter of HCl (hydrochloric acid). General selective deposition processes for formation of the activation layer 232 from an activation solution are known to one of ordinary skill in the art of integrated circuit fabrication.

In addition, for further cleaning away copper containing particles from the exposed surface of hard-mask dielectric material 224, a cleaning process may also be performed after formation of the activation layer 232 (step 212 of FIG. 5). A rotating brush is again applied on the exposed surface of hard-mask dielectric material 224, and the cleaning solution is again applied on the exposed surface of hard-mask dielectric material 224 to clean away copper containing particles from the exposed surface of the hard-mask dielectric material 224, after formation of the activation layer 232.

Figure 11:
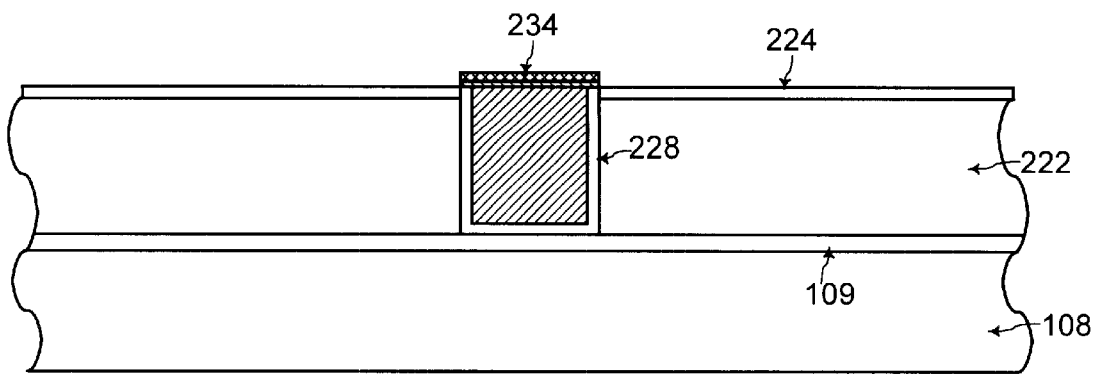

Referring to FIGS. 10 and 11, after formation of the activation layer 232, a capping material 234 is selectively formed on the activation layer 232 covering the diffusion barrier material 228 and the conductive fill material 230 (step 214 of FIG. 5). According to a general aspect of the present invention, the capping material 234 is comprised of an amorphous alloy or a microcrystalline alloy having stuffed grain boundaries. For example, when the capping material 234 is comprised of CoP (cobalt phosphide) alloy, a microcrystalline alloy is formed with $Co_3P$ stuffing the cobalt grain boundaries. With addition of W (tungsten) to form CoWP (cobalt tungsten phosphide) for the capping material 234, the capping material 234 is further densified to form an amorphous alloy with minimized grain boundaries. Such stuffed or minimized grain boundaries for the capping material 234 results in the capping material 234 being impervious to carbon, oxygen, chlorine, and/or hydrogen and compounds of such elements forming porogen fragments that are the volatile by-products formed during later thermal curing of the low-K precursor material 222.

In one embodiment of the present invention, the capping material 234 is comprised of a ternary amorphous alloy comprised of three elements, such as CoWP (cobalt tungsten phosphide), CoWB (cobalt tungsten boride), CoMoP (cobalt molybdenum phosphide), CoMoB (cobalt molybdenum boride), CoReP (cobalt rhenium phosphide), or CoReB (cobalt rhenium boride), according to one embodiment of the present invention. Such a ternary alloy is selectively formed on the activation layer 232 in an electroless deposition process. Alternatively, referring to FIG. 12, the present invention may also be practiced when the capping layer 234 is selectively formed on the exposed surface of the diffusion barrier material 228 and the conductive fill material 230 in an electroless deposition process without formation of the activation layer 232.

Figure 12:
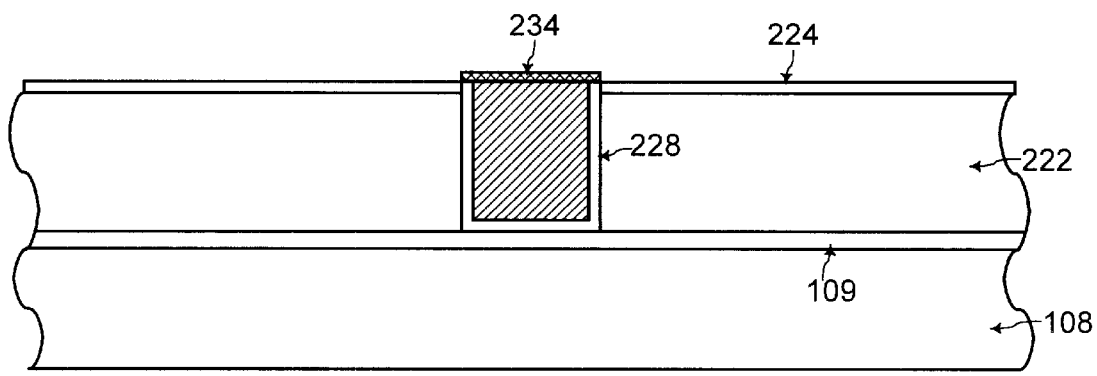

In one embodiment of the present invention, the capping layer 234 is selectively formed on the activation layer 232 in FIG. 11 (or on the exposed surface of the diffusion barrier material 228 and the conductive fill material 230 without formation of the activation layer 232 in FIG. 12) in an electroless deposition process with an electroless deposition electrolyte comprised of:

from about 10 grams/liter to about 40 grams/liter of $CoSO_4$ (cobalt sulfate) as a cobalt source;

from about 0.05 grams/liter to about 30 grams/liter of ammonium tungstate or tetramethyl ammonium tungstate as a tungsten source for forming CoWP or CoWB as the capping material 234, or from about 0.05 grams/liter to about 30 grams/liter of ammonium molybdenate or tetramethyl ammonium molybdenate as a molybdenum source for forming CoMoP or CoMoB as the capping material 234, or from about 0.05 grams/liter to about 30 grams/liter of ammonium rhenate or tetramethyl ammonium rhenate as a rhenium source for forming CoReP or CoReB as the capping material 234;

from about 60 grams/liter to about 90 grams/liter of ammonium citrate or tetramethyl ammonium citrate as a complexing agent;

from about 40 grams/liter to about 80 grams/liter of ammonium hydroxide or tetramethyl ammonium hydroxide as a pH adjuster for adjusting the pH of the electroless deposition electrolyte to be in a range of from about 6.5 to about 14;

from about 10 grams/liter to about 40 grams/liter of ammonium hypophosphite for a phosphorus source as a reducing agent for forming CoWP, CoMoP, or CoReP as the capping material 234, or from about 10 grams/liter to about 40 grams/liter of borane dimethylamine for a boron source as a reducing agent for forming CoWB, CoMoB, or CoReB as the capping material 234;

water ($H_2O$); and from about 0.01 grams/liter to about 0.02 grams/liter total of at least one of a surfactant and a stabilizer.

In one example, the surfactant is comprised of RE610, and the stabilizer is comprised of 2,2'-dipyridyl.

In another embodiment of the present invention, the above described electroless deposition electrolyte for forming the capping layer 234 is also comprised of 1–3 grams/liter of boric acid ($H_3BO_3$). Such boric acid within the electroless deposition electrolyte stabilizes the pH of the electroless deposition electrolyte to remain more constant over time.

In addition, such an electroless deposition electrolyte during formation of the capping material 234 is at a temperature of from about 55° Celsius to about 92° Celsius. In one embodiment, the capping material 234 is comprised of CoWP (cobalt tungsten phosphide) with a phosphorous content of about 7–12 atomic percent and with a tungsten content of about 2–4 atomic percent. In that embodiment, the electroless deposition process is performed with the electroless deposition electrolyte being at a temperature of from about 60° Celsius to about 85° Celsius for a time period of from about 0.5 minutes to about 2 minutes for forming the capping material 234 having a thickness of from about 100 Å (angstroms) to about 500 Å (angstroms). Electroless deposition processes in general are known to one of ordinary skill in the art of integrated circuit fabrication.

After selective formation of the capping material 234 on the activation layer 232 in FIG. 11 (or on the exposed surface of the diffusion barrier material 228 and the conductive fill material 230 without formation of the activation layer 232 in FIG. 12) in the electroless deposition process, the capping material 234 and the exposed surface of the layer of hard-mask dielectric material 224 are rinsed in water ($H_2O$) and may be dried in a nitrogen gas ($N_2$) flow (step 216 of FIG.

5). In addition, for further cleaning away copper containing particles from the exposed surface of hard-mask dielectric material 224, a cleaning process may also be performed after selective formation of the capping material 234 (step 216 of FIG. 5). A rotating brush is again applied on the exposed surface of hard-mask dielectric material 224, and the cleaning solution is again applied on the exposed surface of hard-mask dielectric material 224 to clean away copper containing particles from the exposed surface of hard-mask dielectric material 224, after formation of the capping material 234.

In the embodiment where the activation layer 232 is formed between the conductive fill material 230 and the capping material 234, an initial thermal anneal process is performed at a temperature in a range of from about 150° Celsius to about 350° Celsius. Such a temperature is lower than the temperature used for curing the low-K precursor material 222. During this initial thermal anneal process, the element comprising the activation layer 232 diffuses a relatively short distance into the capping material 234 and into the conductive fill material 230 to form an adhesion layer between the conductive fill material 230 and the capping material 234. Such an adhesion layer enhances the bonding between the conductive fill material 230 and the capping material 234. Furthermore, in the embodiment where the activation layer 232 is formed such that the capping material 234 is formed onto the activation layer 232, the electroless deposition electrolyte as described herein may be at a lower temperature of from about 55° Celsius to about 65° Celsius during the electroless deposition process for selectively forming the capping material 234 on the activation layer 232.

Generally, for forming the capping layer 234 comprised of a ternary amorphous alloy, selectivity (i.e., selectively growing the material of the capping layer 234 and/or the activation layer 232 substantially only on the exposed surface of the conductive fill 230 and the diffusion barrier material 228) is important. For ensuring such selectivity, exposed surfaces of the surrounding dielectric material 224 and the exposed surfaces of the conductive fill 230 and the diffusion barrier material 228 are thoroughly cleaned according to one embodiment of the present invention as follows:

a.) in FIG. 9, the exposed surfaces of the surrounding dielectric material 224 are cleaned to clean away copper residue from such surfaces using a cleaning solution comprised of one of the following: citric acid, 5-aminotetrazol, and water ($H_2O$); citric acid, benzotriazole (BTA), and water ($H_2O$); citric acid, polyvinyl alcohol (PVA), amidizole, and water ($H_2O$); or citric acid, polyvinyl alcohol (PVA), triethanolamine, and water ($H_2O$);

b.) further in FIG. 9, the exposed surfaces of the conductive fill 230 and the diffusion barrier material 228 are cleaned to clean away copper oxides and copper organic complexes using one of a hydrochloric acid ($H_2O$ with HCl) solution or a sulfuric acid ($H_2O$ with $H_2SO_4$) solution;

c.) referring to FIG. 10, the palladium activation layer 232 is formed as described herein;

d.) referring to FIG. 11, the capping layer 234 is formed on the activation layer 232 as described herein; and e.) further referring to FIG. 11, the exposed surfaces of the surrounding dielectric material 224 are cleaned after formation of the capping layer 234 to clean away copper, palladium, or cobalt residues from such surfaces using a cleaning solution comprised of one of the following: citric acid, 5-aminotetrazol, and water ($H_2O$); citric acid, benzotriazole (BTA), and water ($H_2O$); citric acid, polyvinyl alcohol (PVA), amidizole, and water ($H_2O$); or citric acid, polyvinyl alcohol (PVA), triethanolamine, and water ($H_2O$).

In addition, a water rinse may be performed after each of the above steps a, b, c, d, and e. In an alternative embodiment of the present invention, an additional cleaning step may be performed after the step c for forming the activation layer 232 and before the step d. However, such a cleaning step may reduce the catalytic activity of the activation layer 232. In that case, the additional cleaning step after the step c and before the step d is not performed.

Figure 13:
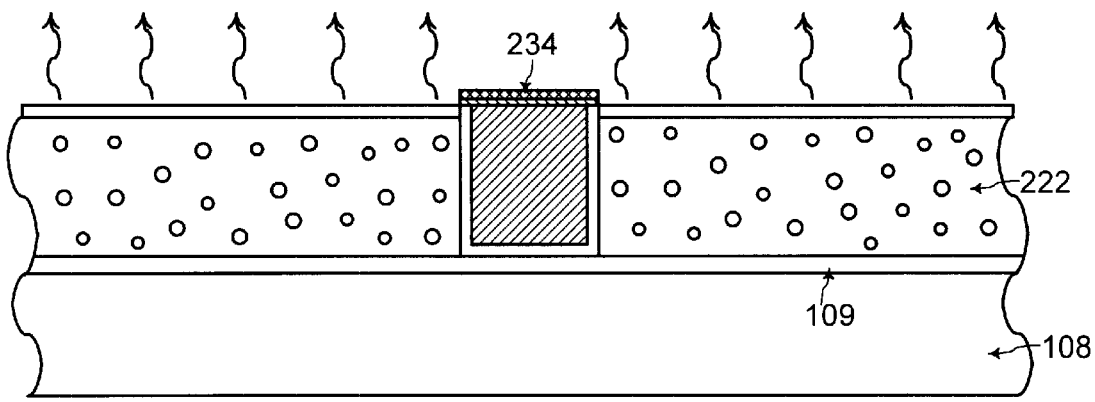

In any case of the capping material 234 being selectively formed on the activation layer 232 in FIG. 11 or on the exposed surface of the diffusion barrier material 228 and the conductive fill material 230 without formation of the activation layer 232 in FIG. 12, referring to FIG. 13, a thermal curing process is performed at a temperature greater than about 390° Celsius for curing the low-K precursor material 222 to become a porous low-K dielectric material having significantly sized pores (step 218 of FIG. 5). Such thermal curing processes, for transforming the low-K precursor material into the porous low-K dielectric material, in general are known to one of ordinary skill in the art of integrated circuit fabrication.

During such curing of the low-K precursor material 222 to become a porous low-K dielectric material, carbon, oxygen, chlorine, and/or hydrogen and compounds of such elements forming porogen fragments are out-gassing volatile by-products that are generated from the low-K precursor material 222. The layer of hard-mask dielectric material 224 that is comprised of alkoxysilane in one embodiment of the present invention is transparent to the volatile by-products formed from the low-K precursor material 222 during such a thermal curing process. Thus, such volatile by-products formed from the low-K precursor material 222 readily diffuse out through the layer of hard-mask dielectric material 224 comprised of alkoxysilane. The present invention may be practiced with or without formation of the layer of hard-mask dielectric material 224 on the low-K precursor material 222. Without the layer of hard-mask dielectric material 224, the volatile by-products formed from the low-K precursor material 222 during the thermal curing process simply evaporate away from the low-K precursor material 222 that becomes the porous low-K dielectric material.

In addition, during the thermal curing process, the capping material 234 that is an amorphous alloy or a microcrystalline alloy having stuffed grain boundaries is impervious to carbon, oxygen, chlorine, and/or hydrogen and compounds of such elements forming porogen fragments that are the volatile by-products. Such volatile by-products from the low-K precursor material 222 may degrade the copper conductive fill 230 when such volatile by-products come in contact with the copper conductive fill 230. However, in the present invention, the capping material 234 is formed to encapsulate the top surface of the copper conductive fill 230 to prevent contact of the volatile by-products with the copper conductive fill 230, especially the top surface of the copper conductive fill 230 during the thermal curing process.

With prevention of such contact, the volatile by-products that are generated from the low-K precursor material 222 during the thermal curing process do not degrade the copper conductive fill 230 to preserve the integrity of the interconnect structure formed within the interconnect opening.

Furthermore, in this manner, because the interconnect opening 226 is formed and filled within the low-K precursor material 222 that is not completely cured, the sidewalls of such an interconnect opening 226 do not have any significantly sized opened pores during filling of the interconnect opening. Thus, formation of voids, and in turn, electromigration failure of the interconnect structure is minimized.

Figure 14:
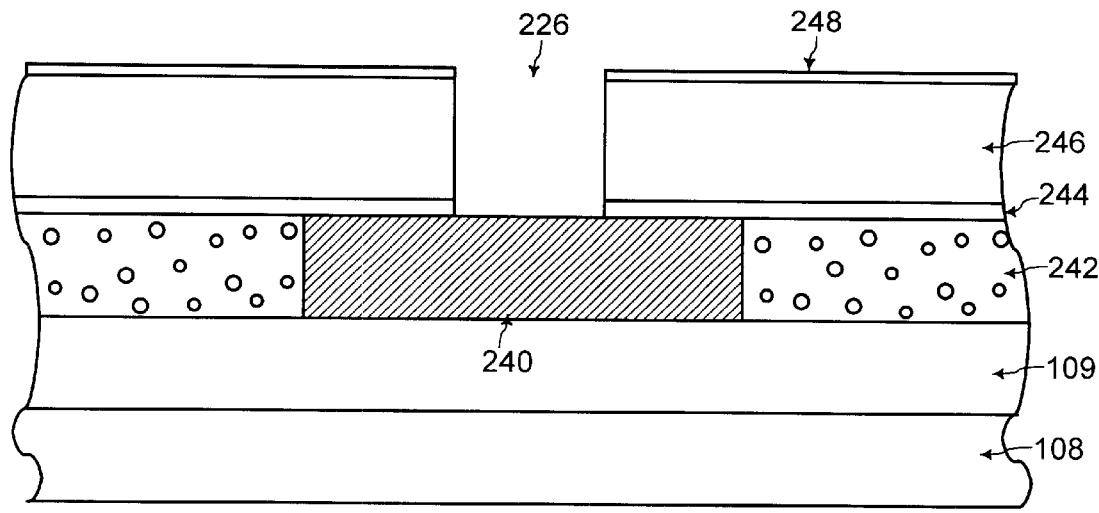
FIGS. 14, 15, and 16 show cross-sectional views for forming an interconnect structure within an interconnect opening that is a via hole in porous low-K dielectric material, with minimized electromigration failure and degradation of the interconnect structure following the flow-chart of FIG. 5, according to an embodiment of the present invention.
Figure 17:
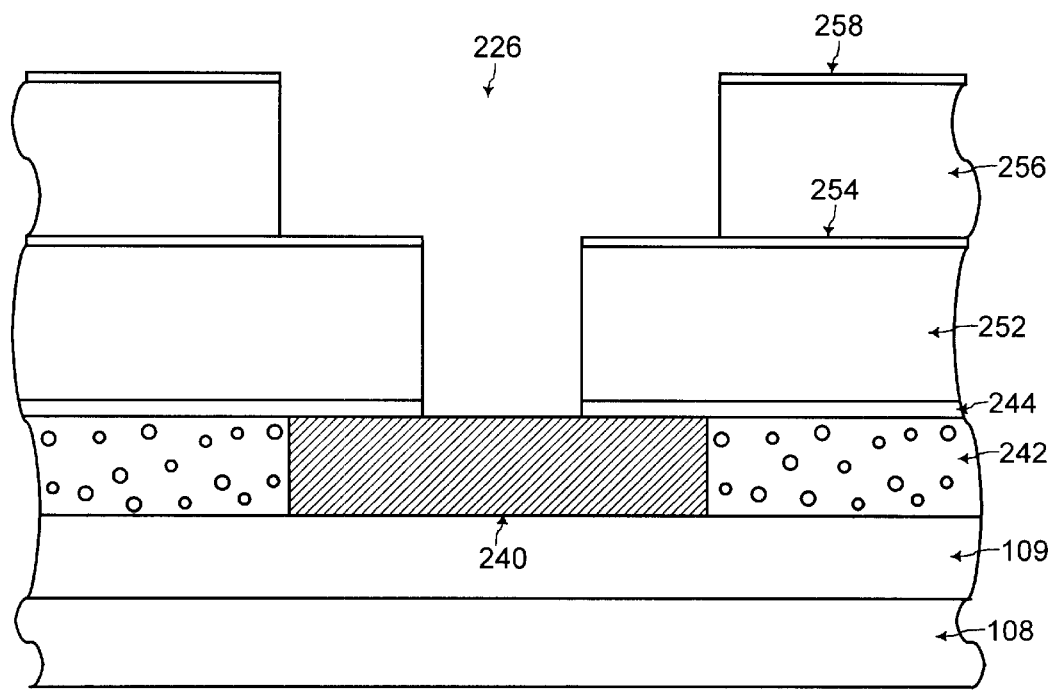
FIGS. 17, 18, and 19 show cross-sectional views for forming an interconnect structure within an interconnect opening that is a dual damascene opening in porous low-K dielectric material, with minimized electromigration failure and degradation of the interconnect structure following the flow-chart of FIG. 5, according to an embodiment of the present invention.

In FIGS. 7, 8, 9, 10, 11, 12, and 13, the interconnect opening 226 is a trench for a metal line. In another embodiment of the present invention, the interconnect opening 226 may be formed over a conductive interconnect structure that is formed on the layer of dense dielectric material 109. Referring to FIG. 14, the interconnect opening 226 is a via hole formed within a low-K precursor material 246 over a conductive interconnect structure 240. Referring to FIG. 17, the interconnect opening 226 is a dual damascene opening formed over the conductive interconnect structure 240 that is formed on the layer of dense dielectric material 109. The conductive interconnect structure 240 is formed within another layer of porous low-K dielectric material 242 capped by a hard-mask material 244.

In the dual damascene opening 226 of FIG. 17, both a lower opening is formed within a bottom low-K precursor material 252 for forming a via plug to the conductive interconnect structure 240, and an upper opening is formed in an upper low-K precursor material 256. The upper opening formed in the upper low-K precursor material 256 is for an upper conductive interconnect structure. With the dual damascene opening 226 of FIG. 17, the via structure and the upper conductive interconnect structure are formed substantially simultaneously on the lower conductive interconnect structure 240. Dual damascene openings and via holes in general are known to one of ordinary skill in the art of integrated circuit fabrication.

The low-K precursor material 246 surrounding the via hole 226 of FIG. 14, and the bottom and upper low-K precursor materials 252 and 256 surrounding the dual damascene opening 226 of FIG. 17 are comprised of low-K precursor material that is similar as described for the low-K precursor material 222 of FIGS. 6–12. In addition, a layer of hard-mask dielectric material 248 is formed on the low-K precursor material 246 surrounding the via hole 226 of FIG. 14, and a respective layer of hard-mask dielectric material 254 or 258 is formed on each of the bottom and upper low-K precursor materials 252 and 256 surrounding the dual damascene opening 226 of FIG. 17. The layers of hard-mask dielectric material 248, 254, or 258 for the via hole or the dual damascene opening in FIGS. 14 and 17 are similar to the layer of hard-mask dielectric material 224 of FIGS. 6–13 as described herein.

Figure 15:
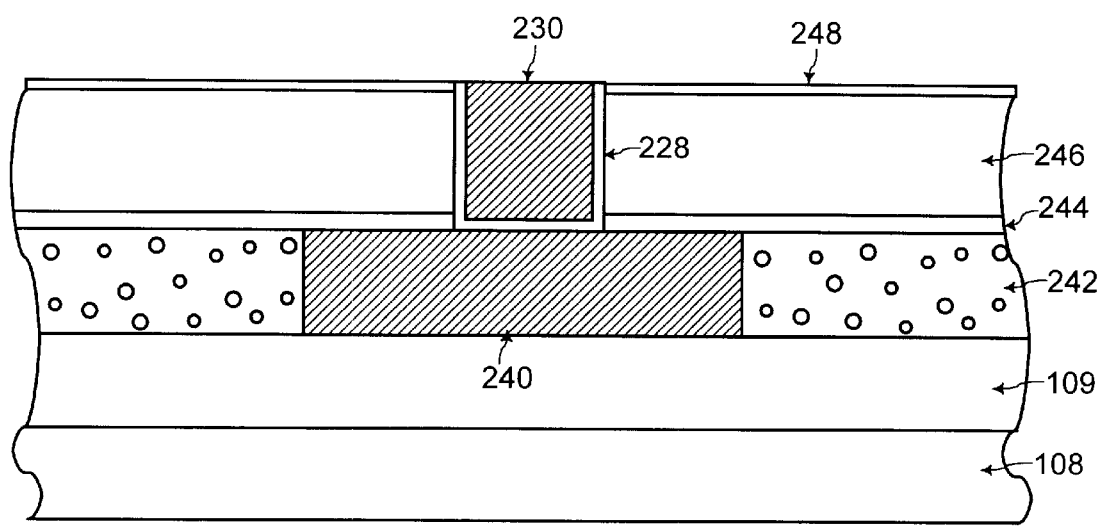
Figure 16:
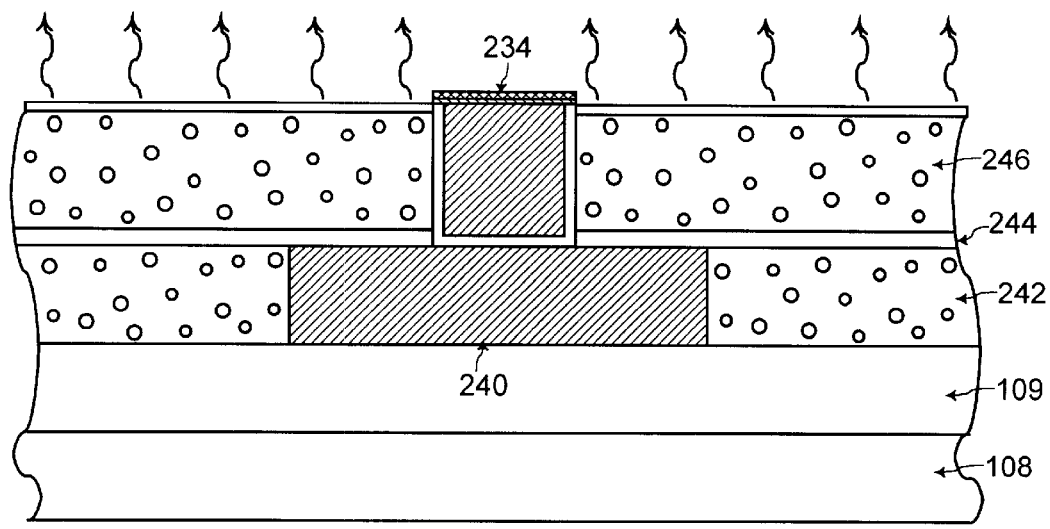

Referring to FIGS. 14 and 15, the via hole 226 is filled with the diffusion barrier material 228 and the copper conductive fill material 230 polished to be contained within via hole 226, similar as described for the metal line 226 of FIGS. 6–13. Referring to FIGS. 15 and 16, the capping material 234 is selectively formed to encapsulate the exposed top surface of the diffusion barrier material 228 and the copper conductive fill material 230 within the via hole 226. As described with reference to FIGS. 11 and 12, the capping material 234 for the via hole in FIG. 16 is comprised of an amorphous alloy or a microcrystalline alloy having stuffed grain boundaries formed in an electroless deposition process. Thus, during the thermal curing process for curing the low-K precursor material 246 to become the porous low-K dielectric material in FIG. 16, such a capping material 234 is impervious to carbon, oxygen, chlorine, and/or hydrogen and compounds of such elements forming porogen fragments that are volatile by-products that are generated from the low-K precursor material 246 for preserving the integrity of the via plug interconnect structure within the via hole 226.

Figure 18:
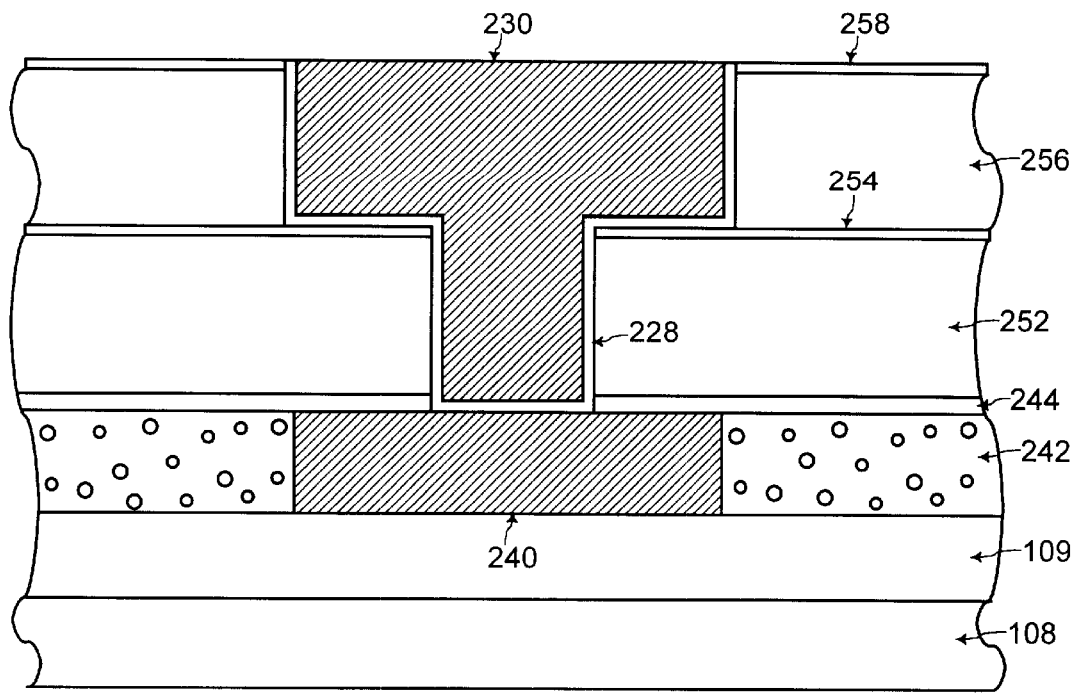
Figure 19:
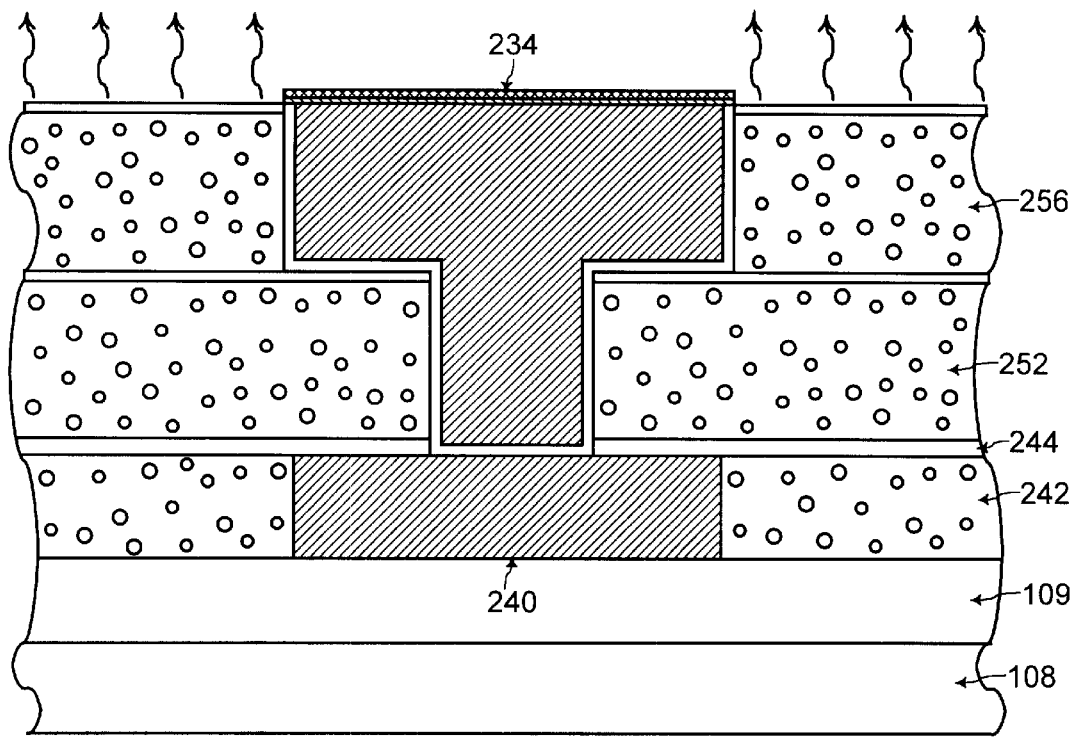

Similarly, referring to FIGS. 17 and 18, the dual damascene opening 226 is filled with the diffusion barrier material 228 and the copper conductive fill material 230 polished to be contained within the dual damascene opening 226, similar as described for the metal line 226 of FIGS. 6–13. Referring to FIGS. 18 and 19, the capping material 234 is selectively formed to encapsulate the exposed top surface of the diffusion barrier material 228 and the copper conductive fill material 230 within the dual damascene opening 226. As described with reference to FIGS. 11 and 12, the capping material 234 for the dual damascene opening in FIG. 19 is comprised of an amorphous alloy or a microcrystalline alloy having stuffed grain boundaries formed in an electroless deposition process. Thus, during the thermal curing process for curing the bottom and upper low-K precursor materials 252 and 256 to become the porous low-K dielectric materials, such a capping material 234 is impervious to carbon, oxygen, chlorine, and/or hydrogen and compounds of such elements forming porogen fragments that are volatile by-products that are generated from the bottom and upper low-K precursor materials 252 and 256 for preserving the integrity of the dual damascene interconnect structure within the dual damascene opening 226.

In this manner, the present invention may be advantageously applied for forming the interconnect structure within the interconnect opening that is any one of the metal line of FIGS. 6–13, the via hole of FIGS. 14–16, or the dual damascene opening of FIGS. 17–19. With electroless deposition for forming the capping material 234, the present invention may be applied for interconnect structures formed within such interconnect openings having a scaled down width dimension as small as hundreds or tens of nanometers.

Referring to FIGS. 11 and 12, in another embodiment of the present invention, the dielectric material 222 surrounding the interconnect structure is comprised of silicon dioxide ($SiO_2$) formed from TEOS (tetraethoxysilane) or from FTEOS (fluorine-doped tetraethoxysilane). For the case of FTEOS, the dielectric material 222 is comprised of silicon dioxide ($SiO_2$) doped with fluorine for having a lower dielectric constant than that of substantially pure silicon dioxide ($SiO_2$). In this embodiment, the layer of hard-mask dielectric material 224 is comprised of a hard-mask dielectric material such as silicon nitride for example. Such materials and processes for formation of such materials are known to one of ordinary skill in the art of integrated circuit fabrication.

In this embodiment, the conductive fill material 230 and the diffusion barrier material 228 are formed within the interconnect opening formed through such a dielectric material 222 and the layer of hard-mask dielectric material 224. In addition, the capping material 234 is formed on the exposed surfaces of the conductive fill material 230 and the diffusion barrier material 228 (without the activation layer 232) as illustrated in FIG. 12. Alternatively, the activation layer 232 and the capping material 234 are formed on the exposed surfaces of the conductive fill material 230 and the diffusion barrier material 228 as illustrated in FIG. 11.

In this embodiment of the dielectric material 222 being comprised of silicon dioxide ($SiO_2$) formed from TEOS (tetraethoxysilane) or from FTEOS (fluorine-doped tetraethoxysilane), the capping material 234 (with or without the activation layer 232) encapsulates the conductive fill material 230 and the diffusion barrier material 228 to reduce electromigration failure of the interconnect structure. The capping material 234 and the activation layer 232 are formed in this embodiment in a similar manner as already described herein with reference to the prior embodiments of the present invention including any cleaning processes for cleaning any surfaces of any dielectric material surrounding the interconnect opening and for cleaning any exposed surfaces of the conductive fill material 230 and the diffusion barrier material 228. In particular, the capping material 234 is comprised of an amorphous alloy or a microcrystalline alloy having stuffed grain boundaries as has been already described herein. Such a capping material 234 is particularly advantageous for preventing electromigration failure of interconnect structures formed in an interconnect opening that may be one of a metal line, a via hole, or a dual damascene opening.

Figure 20:
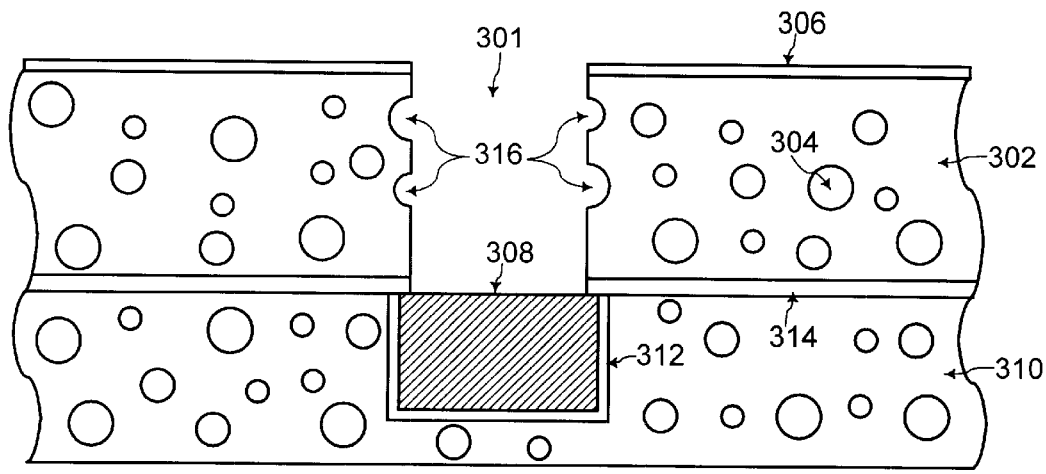
FIGS. 20, 21, 22, 23, and 24 show cross-sectional views for substantially filling opened pores at the sidewalls of the interconnect opening by sputtering a diffusion barrier material at the bottom wall of the interconnect opening before filling the interconnect opening with a conductive fill material to minimize void formation and electromigration failure of the interconnect structure, according to another embodiment of the present invention.

Referring to FIG. 20, in another embodiment of the present invention, an interconnect opening 301 is formed through a layer of porous low-K dielectric material 302. In this embodiment of the present invention, the layer of porous low-K dielectric material 302 is already cured to contain the pores 304. A layer of hard-mask dielectric material 306 is formed over the porous low-K dielectric material 302, and the interconnect opening 301 is formed through the layer of hard-mask dielectric material 306 and the porous low-K dielectric material 302. The hard-mask dielectric material 306 may be comprised of silicon dioxide ($SiO_2$) and silicon nitride (SiN) in one embodiment of the present invention. Because the interconnect opening 301 is formed within the layer of porous low-K dielectric material 302 that already contains the pores 304, sidewalls of the interconnect opening 301 have opened pores 316. Processes for patterning and etching the interconnect opening 301 through the layer of hard-mask dielectric material 306 and the porous low-K dielectric material 302 are known to one of ordinary skill in the art of integrated circuit fabrication.

In addition, in this embodiment of the present invention, the interconnect opening 301 is formed over a bottom interconnect structure 308 comprised of a conductive material within a bottom layer of porous low-K dielectric material 310. When the bottom interconnect structure 308 is comprised of copper, a bottom diffusion barrier material 312 is formed to surround the bottom interconnect structure 308 to prevent diffusion of the copper 308 into the surrounding porous low-K dielectric material 310. A bottom layer of hard-mask dielectric material 314 is formed on the bottom layer of porous low-K dielectric material 310. The present invention however may be practiced when the bottom layer of dielectric material 310 is comprised of any type of dielectric material with or without the bottom layer of hard-mask dielectric material 314. The present invention may be practiced with any type of bottom interconnect structure 308 with or without the bottom diffusion barrier material 312. Furthermore, processes for forming the bottom interconnect structure 308 within the bottom layer of porous low-K dielectric material 310 are known to one of ordinary skill in the art of integrated circuit fabrication.

Figure 21:
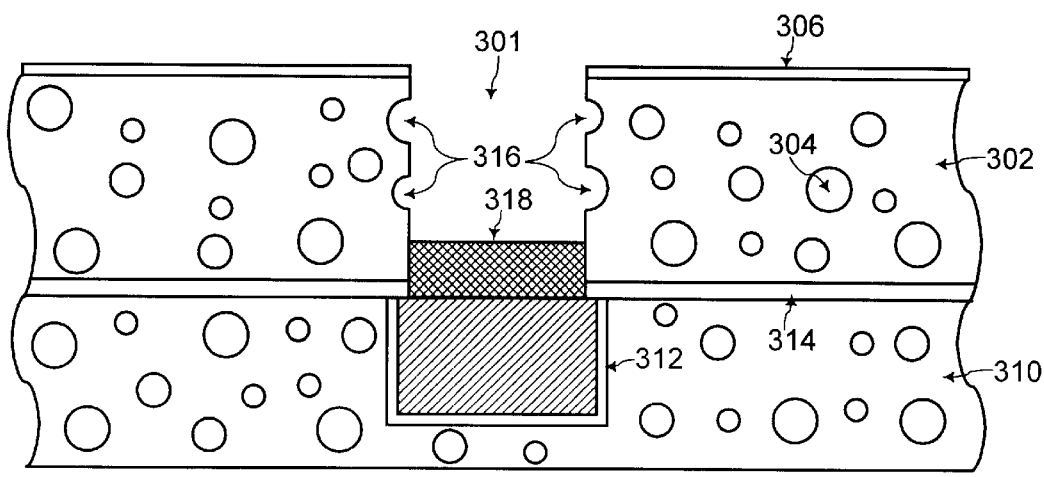

Referring to FIGS. 20 and 21, according to an aspect of the present invention, a diffusion barrier material 318 is formed at the bottom wall of the interconnect opening 301. In one embodiment of the present invention, the diffusion barrier material 318 is a ternary amorphous alloy selectively formed on the exposed surface of the bottom interconnect structure 308 at the bottom wall of the interconnect opening 301 in an electroless deposition process. For example, the diffusion barrier material 318 is comprised of one of one of CoWP (cobalt tungsten phosphide), CoWB (cobalt tungsten boride), CoMoP (cobalt molybdenum phosphide), CoMoB (cobalt molybdenum boride), CoReP (cobalt rhenium phosphide), or CoReB (cobalt rhenium boride), formed in an electroless deposition process. In that case, in one embodiment of the present invention, the diffusion barrier material 318 is formed in the electroless deposition process with an electroless deposition electrolyte comprised of:

from about 10 grams/liter to about 40 grams/liter of $CoSO_4$ (cobalt sulfate) as a cobalt source;

from about 5 grams/liter to about 20 grams/liter of ammonium tungstate or tetramethyl ammonium tungstate as a tungsten source for forming CoWP or CoWB as the diffusion barrier material, or from about 5 grams/liter to about 20 grams/liter of ammonium molybdenate or tetramethyl ammonium molybdenate as a molybdenum source for forming CoMoP or CoMoB as the diffusion barrier material, or from about 5 grams/liter to about 20 grams/liter of ammonium rhenate or tetramethyl ammonium rhenate as a rhenium source for forming CoReP or CoReB as the diffusion barrier material;

from about 70 grams/liter to about 90 grams/liter of ammonium citrate or tetramethyl ammonium citrate as a complexing agent;

from about 5 grams/liter to about 50 grams/liter of ammonium chloride or tetramethyl ammonium chloride;

from about 5 grams/liter to about 15 grams/liter of ammonium hypophosphite for a phosphorus source as a reducing agent for forming CoWP, CoMoP, or CoReP as the diffusion barrier material, or from about 5 grams/liter to about 20 grams/liter of borane dimethylamine for a boron source as a reducing agent for forming CoWB, CoMoB, or CoReB as the diffusion barrier material;

water ($H_2O$); and from about 0.01 grams/liter to about 0.1 grams/liter of a surfactant.

Electroless deposition processes in general are known to one of ordinary skill in the art of integrated circuit fabrication.

In another embodiment of the present invention, the above described electroless deposition electrolyte for forming the diffusion barrier material 318 is also comprised of 1–3 grams/liter of boric acid ($H_3BO_3$). Such boric acid within the electroless deposition electrolyte stabilizes the pH of the electroless deposition electrolyte to remain more constant over time.

In a further embodiment of the present invention, before the diffusion barrier material 318 is deposited on the bottom wall of the interconnect opening, exposed surfaces of any dielectric material and the bottom wall of the interconnect opening are cleaned with citric acid, sulfuric acid, hydrochloric acid, and water ($H_2O$) to reduce contamination. In addition, surfactant and water ($H_2O$) are applied on the bottom wall of the interconnect opening before the diffusion barrier material 318 is deposited on the bottom wall of the interconnect opening.

Figure 22:
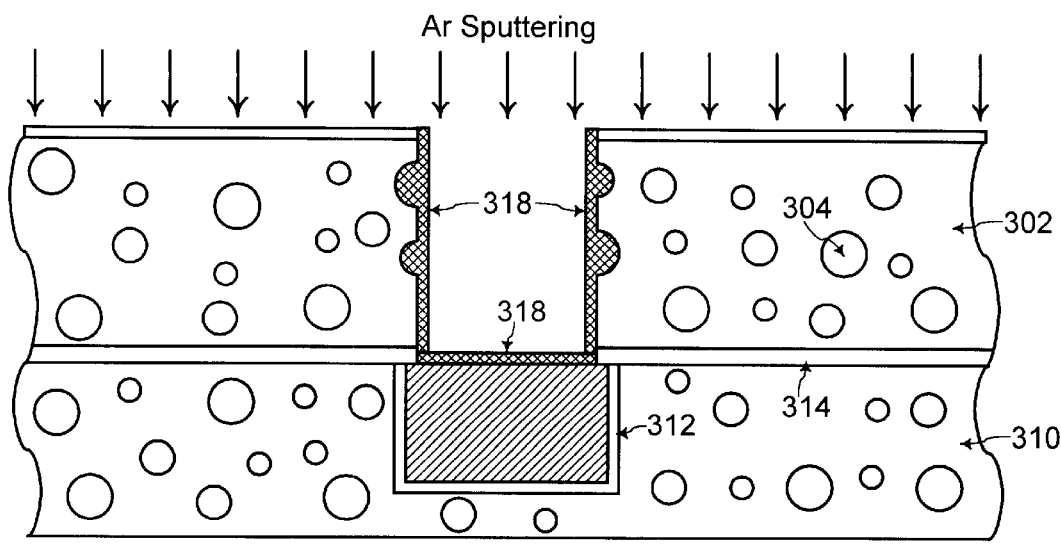

Referring to FIGS. 21 and 22, after formation of the diffusion barrier material 318 at the bottom wall of the integrated circuit opening 301, an argon sputtering process is performed to sputter away the diffusion barrier material 318 from the bottom wall of the interconnect opening 301 onto the sidewalls of the interconnect opening 301. The diffusion barrier material 318 that is sputtered away from the bottom wall of the interconnect opening nucleates within the opened pores 316 at the sidewalls of the interconnect opening 301 to fill the opened pores 316 at the sidewalls.

The diffusion barrier material 318 at the bottom wall of the interconnect opening 301 is deposited with a sufficient thickness to substantially fill the opened pores 316 at the sidewalls depending on the size of the opened pores 316.

In one embodiment of the present invention, the argon sputtering process is performed with a base pressure of $2-5\times10^{-7}$ torr, with an argon gas pressure of $5-15\times10^{-3}$ torr, with an argon gas flow rate of 35–45 sccm (standard cubic centimeters per minute), and for a time period of 1–30 seconds for sputtering the diffusion barrier material having a thickness of about 1–30 nanometers at the bottom wall of the interconnect opening. In another embodiment of the present invention, the argon sputtering process is performed with a base pressure of $2-5\times10^{-7}$ torr, with an argon and nitrogen (Ar and $N_2$) gas pressure of $1-5\times10^{-3}$ torr, with an argon gas flow rate of 15–25 sccm (standard cubic centimeters per minute), with a nitrogen ($N_2$) gas flow rate of 5–15 sccm (standard cubic centimeters per minute), and for a time period of 1–60 seconds for sputtering the diffusion barrier material having a thickness of about 1–30 nanometers at the bottom wall of the interconnect opening. The present invention may be practiced with other types of sputtering processes, and sputtering processes in general are known to one of ordinary skill in the art of integrated circuit fabrication.

Figure 23:
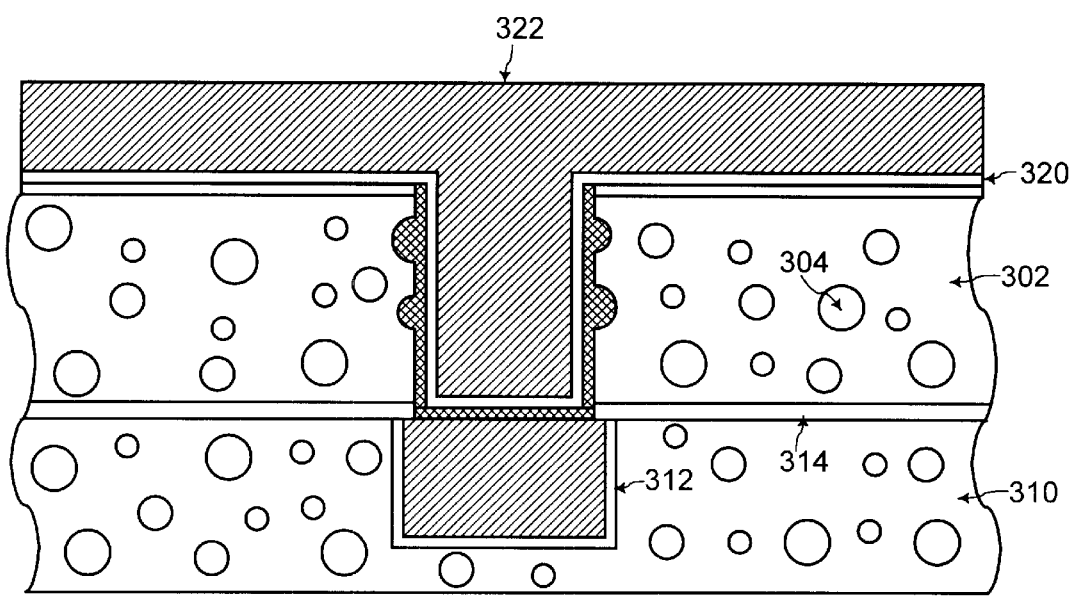

Referring to FIGS. 22 and 23, after the opened pores 318 are substantially filled with the sputtered diffusion barrier material 318, another layer of diffusion barrier material 320 may be conformally deposited on the sidewalls and the bottom wall of the interconnect opening 301. For example, the additional layer of diffusion barrier material 320 is comprised of one of WN (tungsten nitride), TaN (tantalum nitride), or TiSiN (titanium silicon nitride) deposited in one of a CVD (chemical vapor deposition) process or an ALD (atomic layer deposition) process, in one embodiment of the present invention. Such processes for deposition of such diffusion barrier materials are known to one of ordinary skill in the art of integrated circuit fabrication. The present invention may be practiced with or without the additional layer of diffusion barrier material 320.

Further referring to FIG. 23, after deposition of the additional layer of diffusion barrier material 320, a conductive fill material 322 such as copper is deposited to fill the interconnect opening 301. The conductive fill material 322 may be deposited using an electroless deposition process or an electroplating deposition process. Such processes for depositing the conductive fill material 322 for filling the interconnect opening 301 are known to one of ordinary skill in the art of integrated circuit fabrication.

Figure 24:
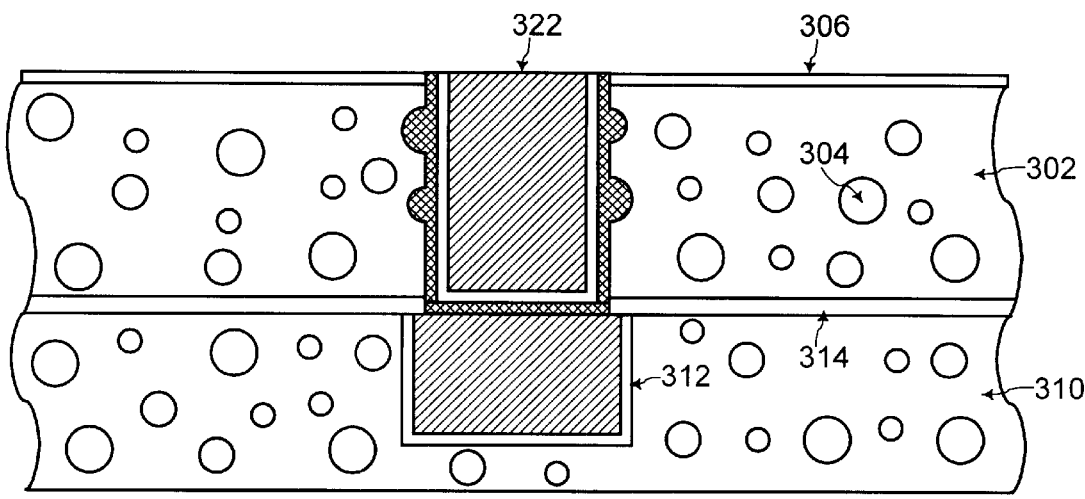

Referring to FIGS. 23 and 24, the conductive fill material 322 and the additional diffusion barrier material 320 on the hard-mask dielectric material 306 are polished away such that the conductive fill material 322 and the additional diffusion barrier material 320 are contained within the interconnect opening 301 to form the interconnect structure. Polishing processes such as CMP (chemical mechanical polishing) processes for polishing down the conductive fill material 322 and the additional diffusion barrier material 320 are known to one of ordinary skill in the art of integrated circuit fabrication.

Figure 25:
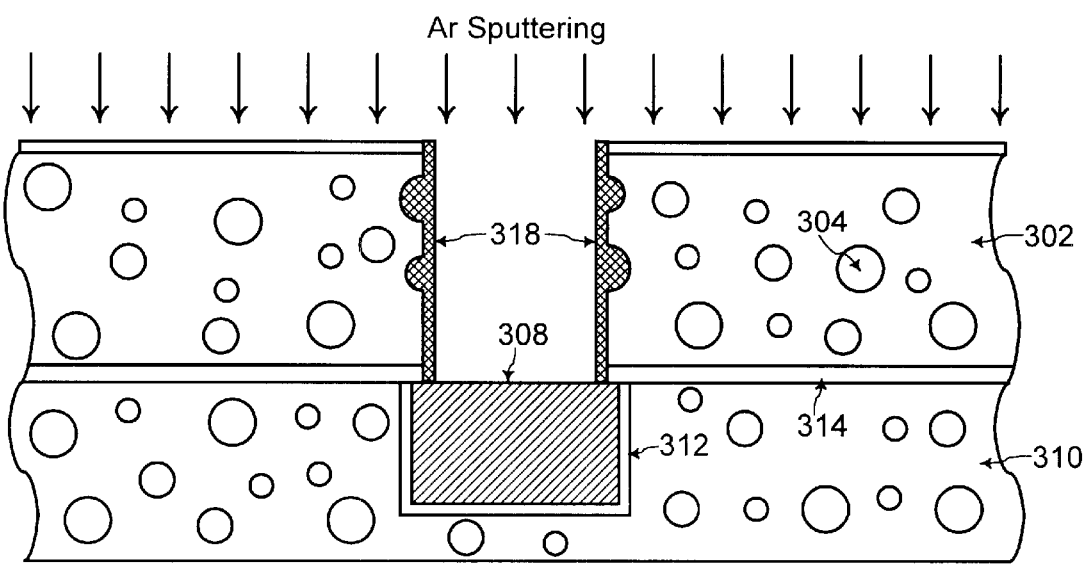
FIGS. 25 and 26 show cross-sectional views illustrating sputtering substantially all of the diffusion barrier material from the bottom wall of the interconnect opening and filling the interconnect opening with an electroless deposition process, according to another embodiment of the present invention.
Figure 26:
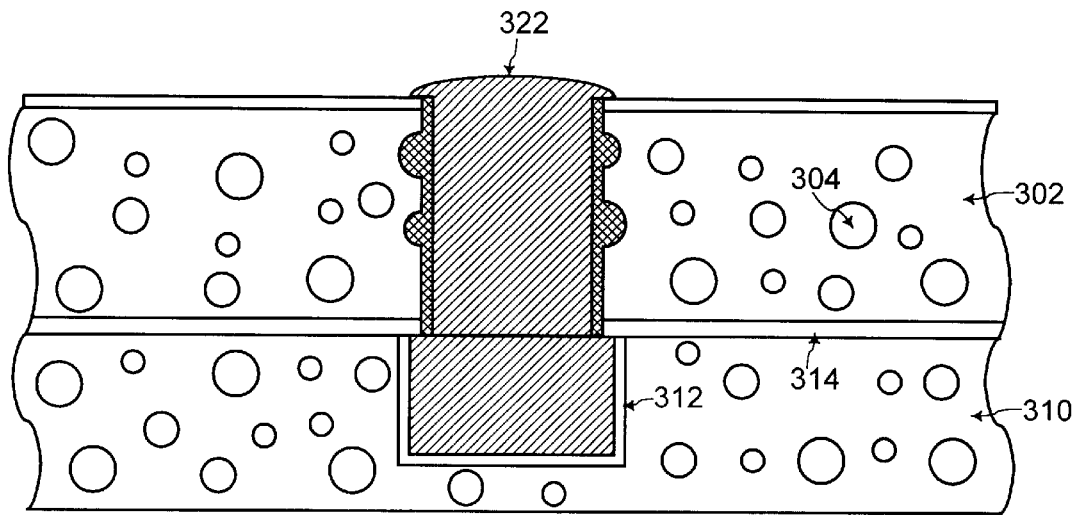

In the embodiment of FIGS. 22, 23, and 24, a portion of the diffusion barrier material 318 remains on the bottom wall of the interconnect opening 302 after sputtering away a portion of the diffusion barrier material 318 to substantially fill the opened pores 316 at the sidewalls of the interconnect opening 301. Referring to FIG. 25, in another embodiment of the present invention, substantially all of the diffusion barrier material 318 is sputtered away from the bottom wall of the interconnect opening 302 to expose the bottom interconnect structure 308. Referring to FIG. 26, the copper conductive fill 322 is then deposited directly onto the bottom interconnect structure 308. The depth of sputtering for example is determined by controlling the time period of the sputtering process, as known to one of ordinary skill in the art of integrated circuit fabrication.

Such an embodiment is especially advantageous for minimizing resistance of the interconnect structure formed within the interconnect opening 301. Generally, diffusion barrier materials have higher resistance than conductive fill materials. With complete removal of the diffusion barrier material 318 from the bottom wall of the interconnect opening 302, a conductive path is formed between the conductive fill material 322 and the bottom interconnect structure 308 without any diffusion barrier material in the conductive path. Thus, resistance of the conductive path of the conductive fill material 322 and the bottom interconnect structure 308 is advantageously minimized.

In one embodiment of the present invention, the copper conductive fill 322 is selectively deposited in an electroless deposition process from the exposed bottom interconnect structure 308 in FIG. 26. In that case, in one embodiment of the present invention, the copper conductive fill 322 is formed in the electroless deposition process with an electroless deposition electrolyte comprised of:

from about 4 grams/liter to about 10 grams/liter of $CuSO_4$ (copper sulfate) as a copper source;

from about 10 grams/liter to about 20 grams/liter of EDTA (ethylene diamine tetra acetic acid) as a complexing agent;

from about 15 grams/liter to about 30 grams/liter of tetramethyl ammonium hydroxide as a pH adjuster;

from about 1 grams/liter to about 5 grams/liter of glyoxylic acid as a reducing agent;

water ($H_2O$); and from about 0.01 grams/liter to about 0.1 grams/liter total of RE610 as a surfactant, 2,2'-dipyridyl as a stabilizer, and Triton as a wetting agent.

Electroless deposition processes in general are known to one of ordinary skill in the art of integrated circuit fabrication. After the electroless deposition of the copper conductive fill material 322, the copper conductive fill material 322 may be polished down to be contained within the interconnect opening 301.

Figure 27:
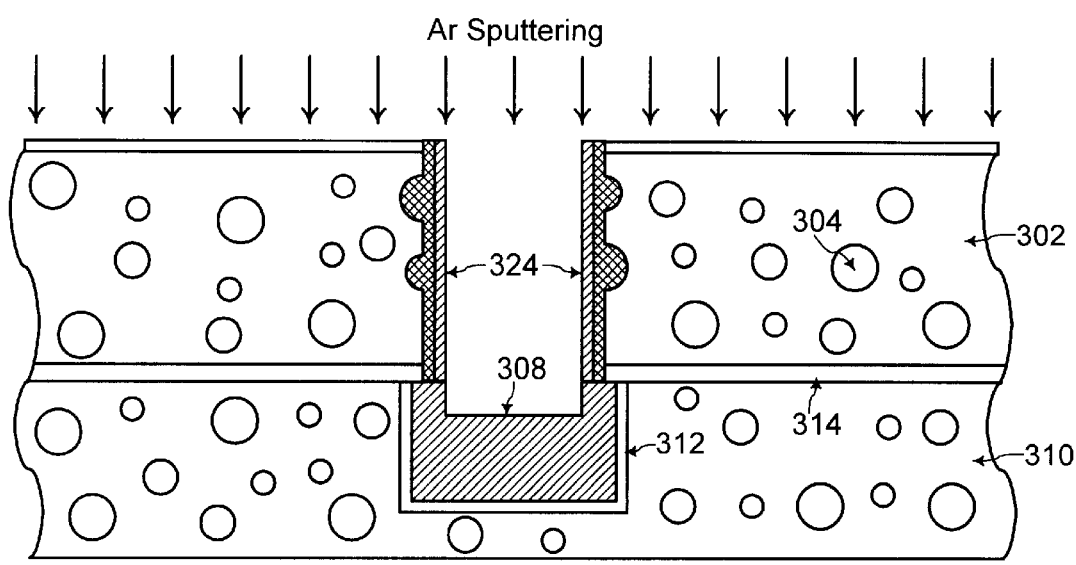
FIGS. 27 and 28 show cross-sectional views illustrating sputtering further down into a conductive material of a bottom interconnect structure to form a seed layer on the sidewalls of the interconnect opening and filling the interconnect opening with an electroless deposition process, according to another embodiment of the present invention.
Figure 28:
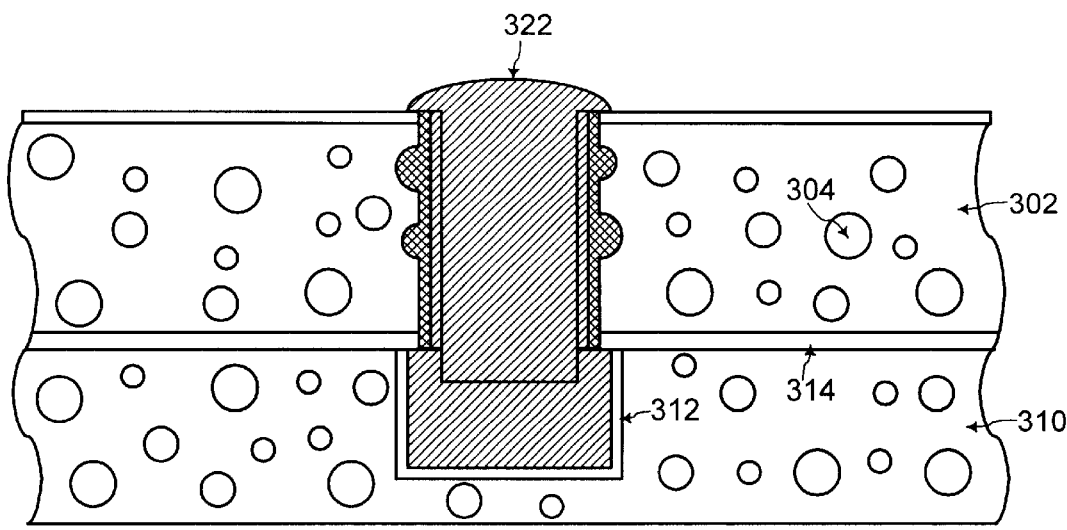

Referring to FIG. 27, in another embodiment of the present invention, the sputtering time period is continued to sputter down further into the bottom interconnect structure 308. In that case, the conductive material of the bottom interconnect structure 308 is then sputtered away from the bottom wall of the interconnect opening 301 onto the sidewalls of the interconnect opening 301 to form a seed layer 324 comprised of the conductive material of the bottom interconnect structure 308. For example, when the bottom interconnect structure 308 is comprised of copper, a copper seed layer 324 is formed on the diffusion barrier material 318 at the sidewalls of the interconnect opening 301. Referring to FIGS. 27 and 28, the copper conductive fill 322 may then be selectively deposited in an electroless deposition process from the bottom interconnect structure 308 and the copper seed layer 324 at the sidewalls of the interconnect opening 301. With such an embodiment, the sputtering process is conveniently used to both fill the opened pores 316 with the diffusion barrier material 318 and to form the copper seed layer 324.

Figure 29:
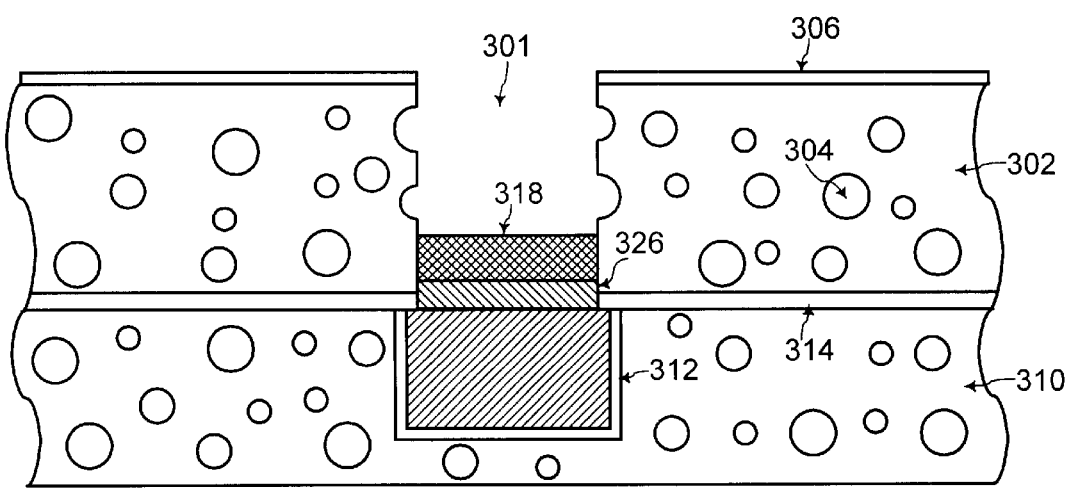
FIGS. 29, 30, and 31 show cross-sectional views illustrating the forming of an activation layer on the bottom wall of the interconnect opening before the diffusion barrier material is formed on the activation layer, according to another embodiment of the present invention.

Referring to FIG. 29, in another embodiment of the present invention, an activation layer 326 is first deposited onto the bottom wall of the interconnect opening 301 before the diffusion barrier material 318 is deposited onto the activation layer 326. In that embodiment, before the activation layer 326 is deposited on the bottom wall of the interconnect opening 301, exposed surfaces of any dielectric material and the bottom wall of the interconnect opening are cleaned with citric acid, sulfuric acid, hydrochloric acid, and water ($H_2O$) to reduce contamination. In addition, surfactant and water ($H_2O$) are applied on the bottom wall of the interconnect opening before the activation layer 326 is deposited on the bottom wall of the interconnect opening.

For example, the activation layer 326 is comprised of one of Pd (palladium), Ag (silver), Co (cobalt), Ni (nickel), Zn (zinc), Sn (tin), or Au (gold). According to one embodiment of the present invention, the activation layer 326 is comprised of Pd (palladium) formed in an activation solution comprised of 0.1–2 milli-liter/liter of $PdCl_2$ (palladium chloride), 2–5 milli-liter/liter of HF (hydrofluoric acid), 1–5 milli-liter/liter of $HNO_3$ (nitric acid), 1–30 milli-liter/liter of HCl (hydrochloric acid), and water ($H_2O$). Activation solutions for forming activation layers in general are known to one of ordinary skill in the art of integrated circuit fabrication.

Figure 30:
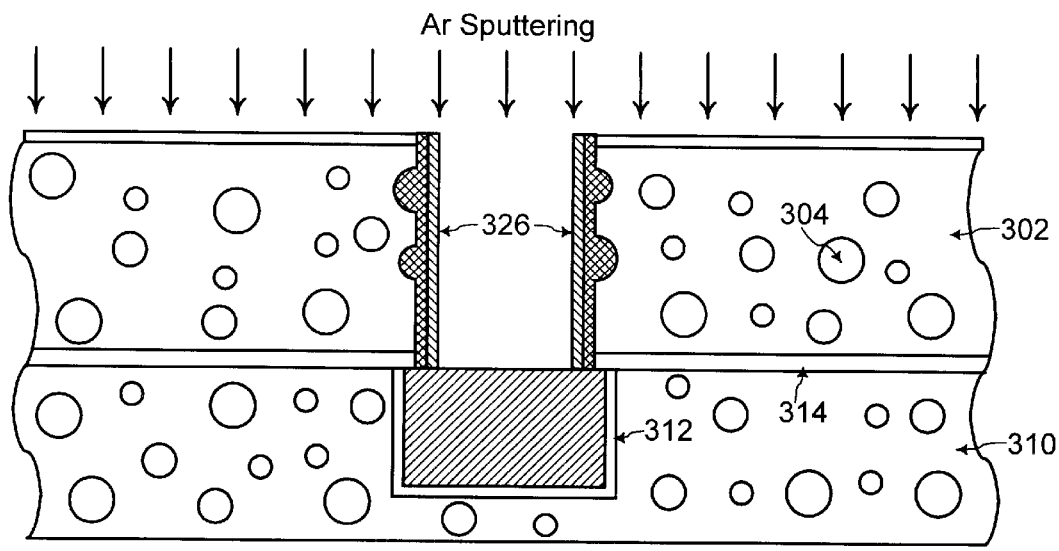
Figure 31:
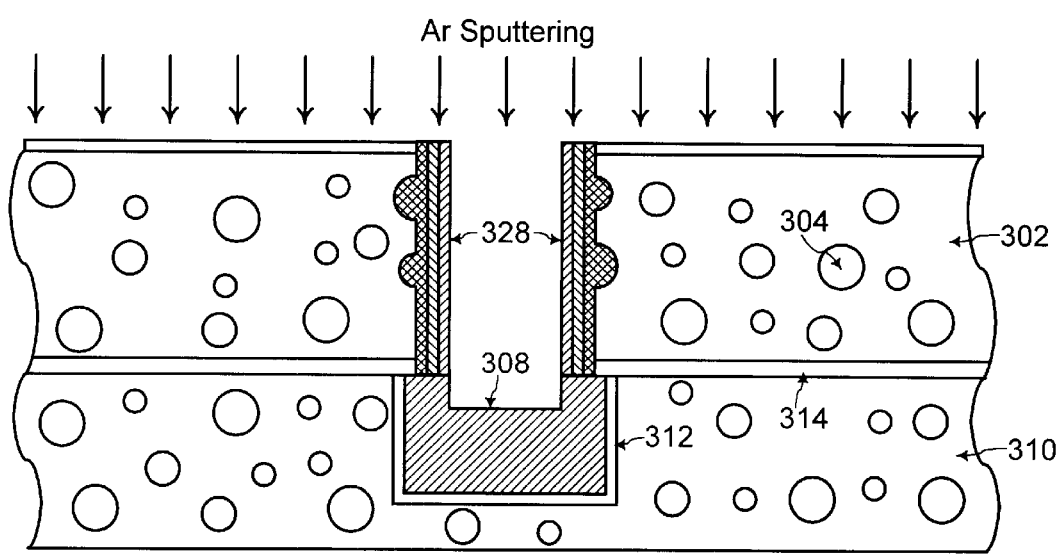

After deposition of the activation layer 326, the diffusion barrier material 318 is then deposited on the activation layer 326 according to processes as already described herein with reference to FIG. 21. Referring to FIGS. 29 and 30, the argon sputtering process is performed to sputter away both the diffusion barrier material 318 and then the activation layer 326 away from the bottom wall of the interconnect opening. In that case, the activation layer 326 forms on the diffusion barrier material 318 filling the opened pores 316 at the sidewalls of the interconnect opening 301. Referring to FIG. 31, the argon sputtering process is continued to sputter away a portion of the conductive material of the bottom interconnect structure 308 at the bottom wall of the interconnect opening 301. Thus, in FIG. 31, a seed layer 328 of the conductive material of the bottom interconnect structure 308 is formed on the activation layer 326 which is formed on the diffusion barrier material 318 filling the opened pores 316 at the sidewalls of the interconnect opening 301.

In either FIG. 30 or FIG. 31, the copper conductive fill 322 may be deposited to fill the interconnect opening 301 using an electroless deposition process as already described herein with respect to FIGS. 26 and 28. With the activation layer 326, after the conductive fill material 322 is deposited to fill the interconnect opening 301, a thermal anneal is performed. During this thermal anneal, the element comprising the activation layer 326 diffuses a relatively short distance into the diffusion barrier material 318 and into the conductive fill material 322 to form an adhesion layer between the conductive fill material 322 and the diffusion barrier material 318. Such an adhesion layer enhances the bonding between the conductive fill material 322 and the diffusion barrier material 318. Furthermore, in the embodiment where the activation layer 326 is formed such that the diffusion barrier material 318 is formed onto the activation layer 326, the electroless deposition electrolyte as described herein may be at a lower temperature during the electroless deposition process for selectively forming the diffusion barrier material 318 on the activation layer 326.

In the embodiments of FIGS. 20–31, the diffusion barrier material 318 is formed at the bottom wall of the interconnect opening 301 after the interconnect opening 301 is formed. In another embodiment of FIG. 32, the diffusion barrier material 318 is formed on the exposed surface of the bottom interconnect structure 308 before the interconnect opening is formed. The diffusion barrier material 318 is selectively formed on the exposed surface of the bottom interconnect structure 308 and of the bottom diffusion barrier material 312 surrounding the bottom interconnect structure 308. For example, the diffusion barrier material 318 is a ternary amorphous alloy comprised of one of CoWP (cobalt tungsten phosphide), CoWB (cobalt tungsten boride), CoMoP (cobalt molybdenum phosphide), CoMoB (cobalt molybdenum boride), CoReP (cobalt rhenium phosphide), or CoReB (cobalt rhenium boride), formed in the electroless deposition process with the electroless deposition electrolyte as already described herein with respect to FIG. 21.

Figure 32:
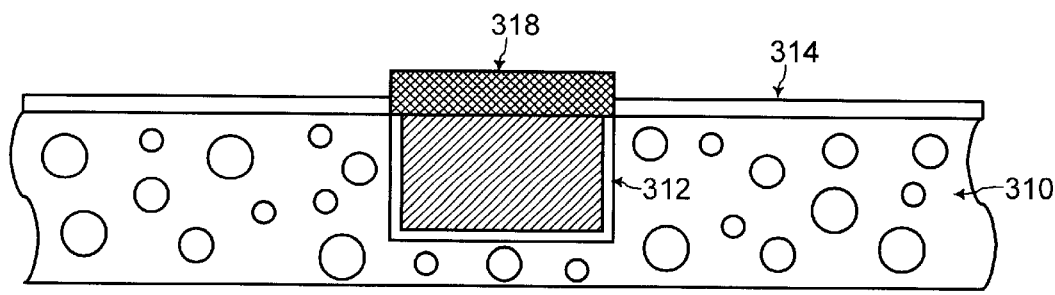
FIGS. 32, 33, 34, and 35 show cross-sectional views illustrating the forming of the interconnect structure within an interconnect opening formed within the porous dielectric material over the diffusion barrier material already formed on a lower interconnect structure, according to another embodiment of the present invention.
Figure 33:
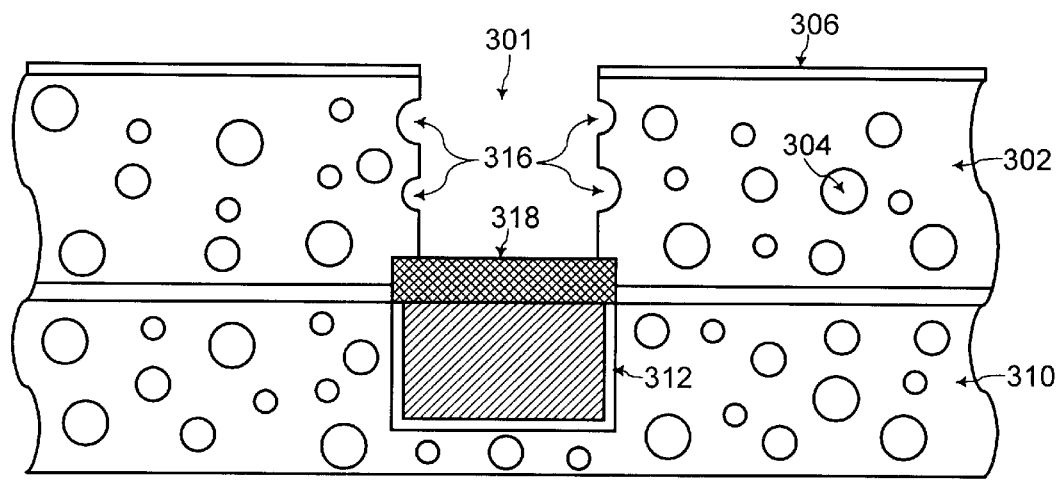

Referring to FIGS. 32 and 33, after formation of the diffusion barrier material 318, the layer of porous low-K dielectric material 304 and the layer of hard-mask dielectric material 306 are deposited. The interconnect opening 301 is then formed through the layer of hard-mask dielectric material 306 and the layer of porous low-K dielectric material 304 and over the diffusion barrier material 318. The interconnect opening 301 formed in FIG. 33 also has opened pores 316 at the sidewalls of the interconnect opening 301.

Figure 34:
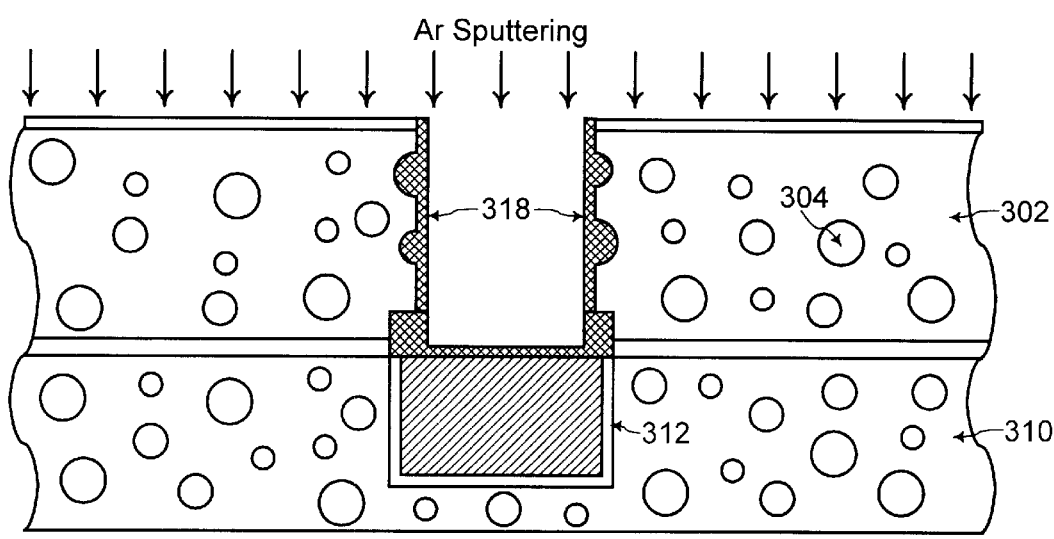

Referring to FIGS. 33 and 34, an argon sputtering process (similarly as already described herein with reference to FIG. 22) is performed to sputter away the diffusion barrier material 318 from the bottom wall of the interconnect opening 301 onto the sidewalls of the interconnect opening 301. The diffusion barrier material 318 that is sputtered away from the bottom wall of the interconnect opening 301 nucleates within the opened pore 316 at the sidewalls of the interconnect opening 301 to fill the opened pores 316 at the sidewalls in FIG. 34. The diffusion barrier material 318 is deposited in FIG. 32 with a sufficient thickness to substantially fill the opened pores 316 at the sidewalls depending on the size of the opened pores 316 in FIG. 34.

Figure 35:
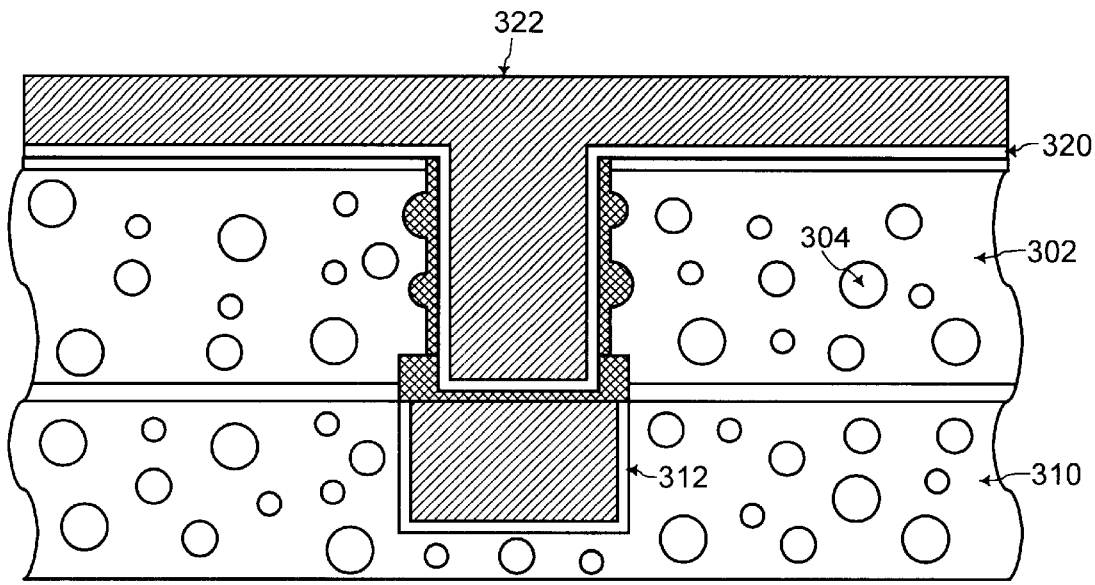

Referring to FIGS. 34 and 35, after the opened pores 318 are substantially filled with the sputtered diffusion barrier material 318, another layer of diffusion barrier material 320 may be conformally deposited on the sidewalls and the bottom wall of the interconnect opening 320 (similarly as already described herein with reference to FIG. 23). The present invention may be practiced with or without the additional layer of diffusion barrier material 320 in FIG. 35. Further referring to FIG. 35, after deposition of the additional layer of diffusion barrier material 320, a conductive fill material 322 such as copper is deposited to fill the interconnect opening 301 (similarly as already described herein with reference to FIG. 23). The conductive fill material 322 and the additional diffusion barrier material 320 on the hard-mask dielectric material 306 may be polished away such that the conductive fill material 322 and the additional diffusion barrier material 320 are contained within the interconnect opening 301 to form the interconnect structure in FIG. 35 (similarly as already described herein with reference to FIG. 24).

Figure 36:
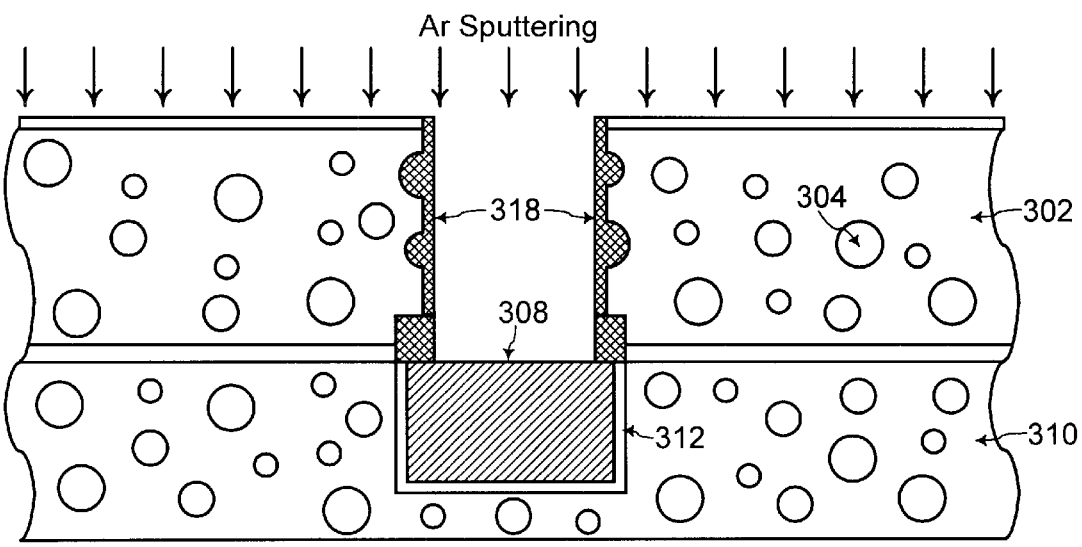
FIGS. 36 and 37 show cross-sectional views illustrating the sputtering of substantially all of the diffusion barrier material from the bottom wall of the interconnect opening and filling the interconnect opening with an electroless deposition process, for the diffusion barrier material already formed on a lower interconnect structure before the interconnect opening is formed, according to another embodiment of the present invention.
Figure 37:
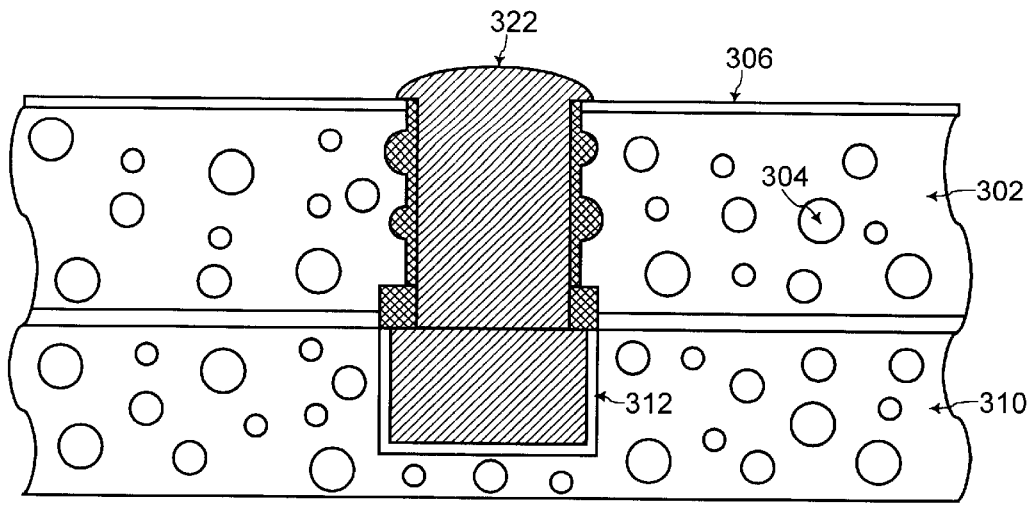
Figure 38:
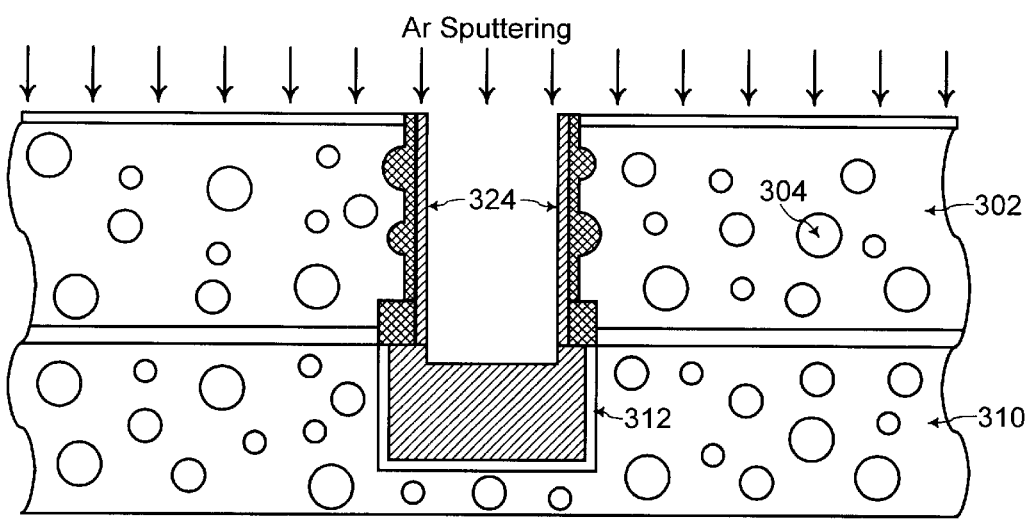
FIG. 38 shows a cross-sectional view illustrating sputtering further down into the conductive material of the lower interconnect structure to form a seed layer on the sidewalls of the interconnect opening and filling the interconnect opening with an electroless deposition process, for the diffusion barrier material already formed on a lower interconnect structure before the interconnect opening is formed, according to another embodiment of the present invention.

FIG. 36 illustrates substantially all of the diffusion barrier material 318 of FIG. 33 at the bottom wall of the interconnect opening 310 being sputtered away to expose the bottom interconnect structure 308 (similarly as already described herein with reference to FIG. 25). Referring to FIG. 37, the copper conductive fill material 322 is then deposited directly onto the bottom interconnect structure 308 (similarly as already described herein with reference to FIG. 26). Referring to FIG. 38, in another embodiment of the present invention, the sputtering process is continued from FIG. 36 to sputter down further into the bottom interconnect structure 308 to form the seed layer 324 comprised of the conductive material of the bottom interconnect structure 308 on the diffusion barrier material 318 at the sidewalls of the interconnect opening 308 (similarly as already described herein with reference to FIG. 27). The copper conductive fill 322 may then be selectively deposited in an electroless deposition process from the bottom interconnect structure 308 and the copper seed layer 324 at the sidewalls of the interconnect opening 301 in FIG. 38 (similarly as already described herein with reference to FIG. 28).

Figure 39:
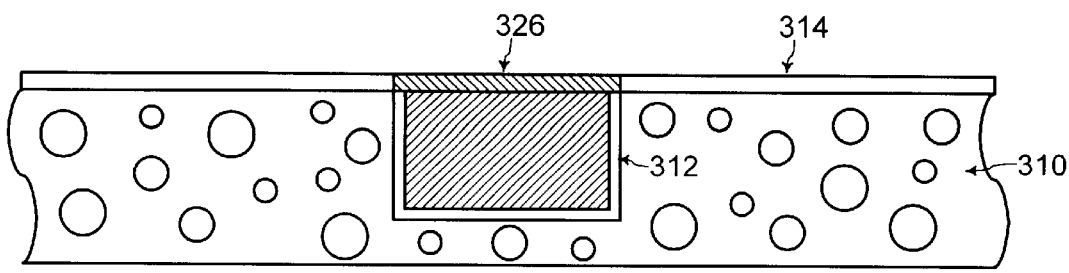
FIGS. 39, 40, 41, 42, and 43 show cross-sectional views illustrating the forming and sputtering of an activation layer on the bottom wall of the interconnect opening before the diffusion barrier material is formed on the activation layer, for the diffusion barrier material already formed on a lower interconnect structure before the interconnect opening is formed, according to another embodiment of the present invention.
Figure 40:
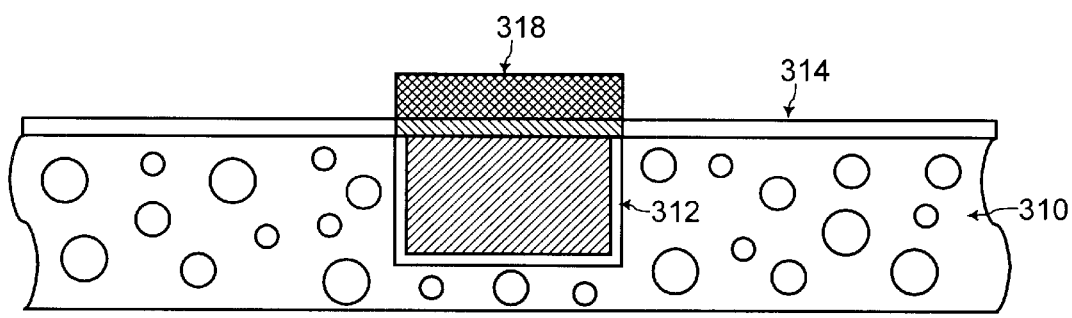

Referring to FIGS. 39 and 40, in another embodiment of the present invention, an activation layer 326 is formed on the exposed surfaces of the bottom interconnect structure 308 and the diffusion barrier material 312 before the diffusion barrier material 318 is formed on the activation layer 326. The activation layer 326 in FIG. 39 is formed in a similar manner as already described with respect to the activation layer 326 of FIG. 29.

Figure 41:
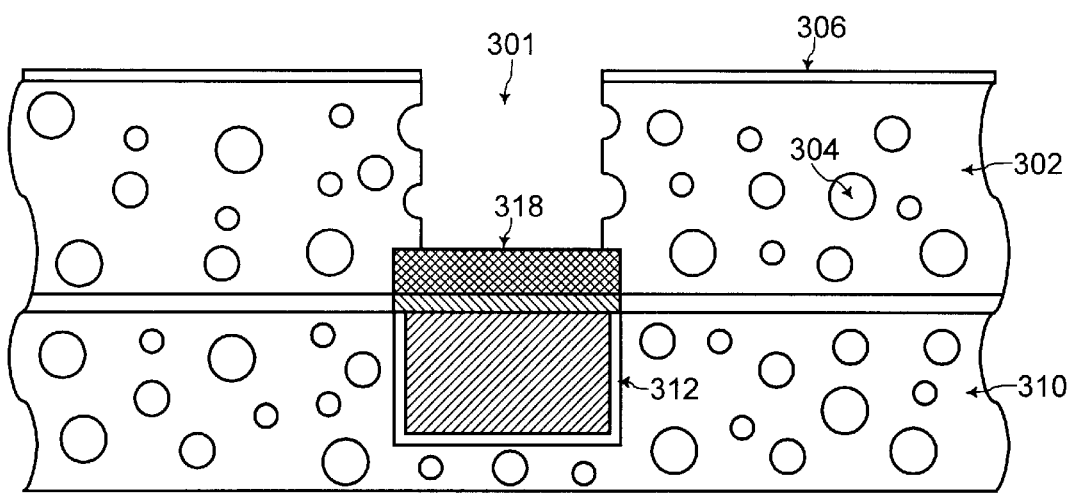

Referring to FIG. 41, after formation of the activation layer 326 and the diffusion barrier material 318 in FIG. 40, the interconnect opening 301 is formed through the layer of hard-mask dielectric material 306 and the layer of porous low-K dielectric material 302 over the diffusion barrier material 318. Thus, in FIG. 39, before the activation layer 326 is deposited on the bottom interconnect structure 308, exposed surfaces of any dielectric material and the bottom interconnect structure 308 are cleaned with citric acid, sulfuric acid, hydrochloric acid, and water ($H_2O$) to reduce contamination. In addition, surfactant and water ($H_2O$) are applied on the bottom interconnect structure 308 before the activation layer 326 is deposited on the bottom interconnect structure 308.

The activation layer 326 in FIG. 39 may be comprised of one of Pd (palladium), Ag (silver), Co (cobalt), Ni (nickel), Zn (zinc), Sn (tin), or Au (gold). According to one embodiment of the present invention, the activation layer 326 in FIG. 39 is comprised of Pd (palladium) formed in an activation solution comprised of 0.1–2 milli-liter/liter of $PdCl_2$ (palladium chloride), 2–5 milli-liter/liter of HF (hydrofluoric acid), 1–5 milli-liter/liter of $HNO_3$ (nitric acid), 1–30 milli-liter/liter of HCl (hydrochloric acid), and water ($H_2O$).

Figure 42:
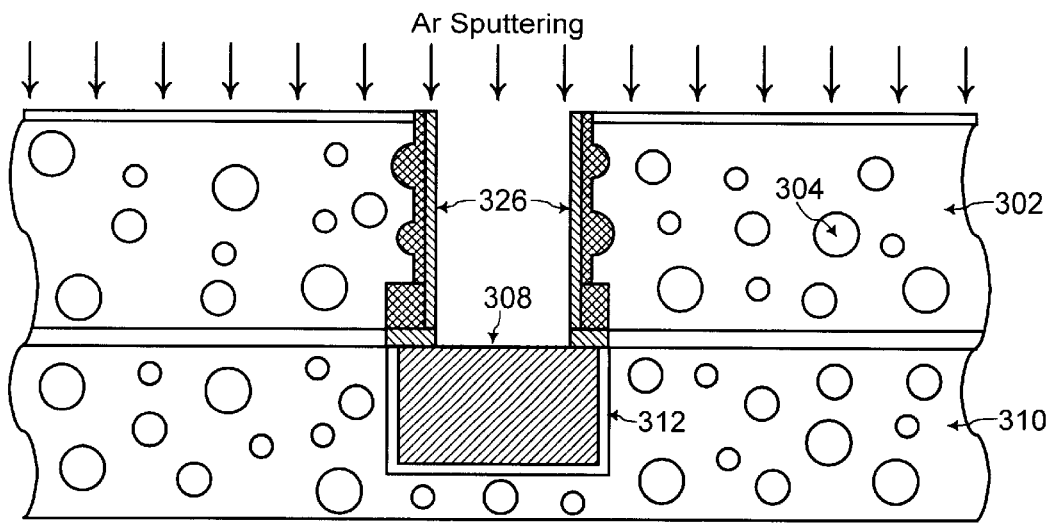
Figure 43:
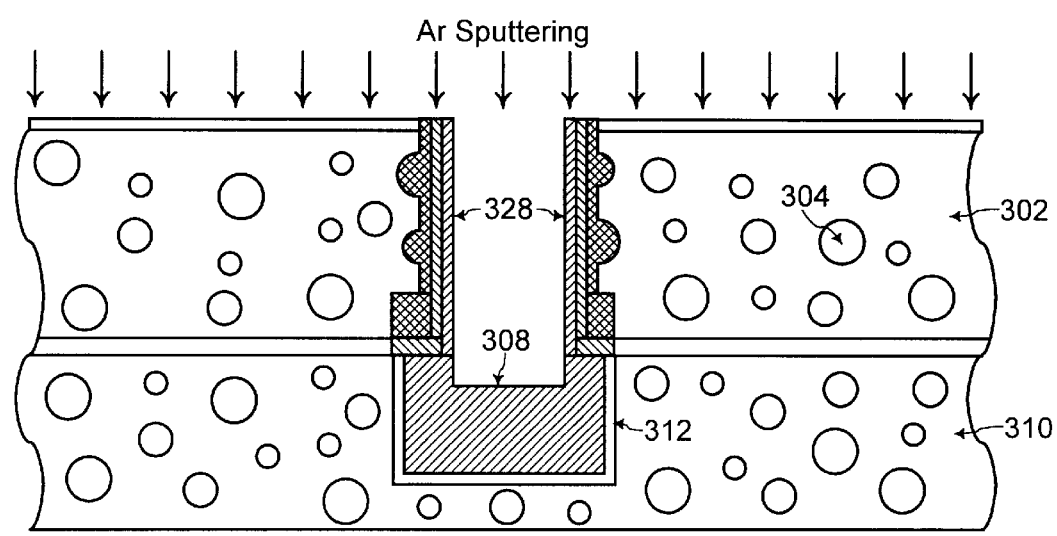

Referring to FIGS. 41 and 42, the diffusion barrier material 318 and the activation layer 318 are sputtered away from the bottom wall of the interconnect opening 301 onto the sidewalls of the interconnect opening (similarly as already described herein with reference to FIG. 30). In that case, the activation layer 326 forms on the diffusion barrier material 318 filling the opened pores 316 at the sidewalls of the interconnect opening 301 in FIG. 42. Referring to FIG. 43, the argon sputtering process is continued to sputter away a portion of the conductive material of the bottom interconnect structure 308 at the bottom wall of the interconnect opening 301. Thus, in FIG. 43, a seed layer 328 of the conductive material of the bottom interconnect structure 308 is formed on the activation layer 326 which is formed on the diffusion barrier material 318 filling the opened pores 316 at the sidewalls of the interconnect opening 301 (similarly as already described herein with reference to FIG. 31).

In either FIG. 42 or FIG. 43, the copper conductive fill 322 may be deposited to fill the interconnect opening 301 using an electroless deposition process as already described herein with respect to FIGS. 26, 28, 30, and 31. With the activation layer 326 in FIGS. 42 or 43, after the conductive fill material 322 is deposited to fill the interconnect opening 301, a thermal anneal is performed. During this thermal anneal, the element comprising the activation layer 326 diffuses a relatively short distance into the diffusion barrier material 318 and into the conductive fill material 322 to form an adhesion layer between the conductive fill material 322 and the diffusion barrier material 318 in FIGS. 42 and 43. Such an adhesion layer enhances the bonding between the conductive fill material 322 and the diffusion barrier material 318. Furthermore, in the embodiment where the activation layer 326 is formed such that the diffusion barrier material 318 is formed onto the activation layer 326, the electroless deposition electrolyte as described herein may be at a lower temperature during the electroless deposition process for selectively forming the diffusion barrier material 318 on the activation layer 326 in FIG. 40.

Generally, for forming the diffusion barrier material 318 comprised of a ternary amorphous alloy, selectivity (i.e., selectively growing the material of the diffusion barrier material 318 and/or the activation layer 326 substantially only on the exposed surface of the bottom conductive material 308 in FIG. 29 and of the bottom conductive material 308 and the diffusion barrier material 312 in FIG. 40) is important. For ensuring such selectivity, exposed surfaces of any dielectric materials and the exposed surfaces of the bottom conductive material 308 and/or the diffusion barrier material 312 are thoroughly cleaned according to one embodiment of the present invention as follows:

a.) the exposed surfaces of any dielectric material are cleaned to clean away copper residue from such surfaces using a cleaning solution comprised of one of the following: citric acid, 5-aminotetrazol, and water ($H_2O$); citric acid, benzotriazole (BTA), and water ($H_2O$); citric acid, polyvinyl alcohol (PVA), amidizole, and water ($H_2O$); or citric acid, polyvinyl alcohol (PVA), triethanolamine, and water ($H_2O$);

b.) the exposed surfaces of the bottom conductive fill 308 and the diffusion barrier material 312 are cleaned to clean away copper oxides and copper organic complexes using one of a hydrochloric acid ($H_2O$ with HCl) solution or a sulfuric acid ($H_2O$ with $H_2SO_4$) solution;

c.) referring to FIGS. 29 and 40, the palladium activation layer 326 is formed as described herein;

d.) referring to FIGS. 29 and 40, the diffusion barrier material 318 is formed on the activation layer 326 as described herein; and e.) the exposed surfaces of any dielectric material are cleaned after formation of the diffusion barrier material 318 to clean away copper, palladium, or cobalt residues from such surfaces using a cleaning solution comprised of one of the following: citric acid, 5-aminotetrazol, and water ($H_2O$); citric acid, benzotriazole (BTA), and water ($H_2O$); citric acid, polyvinyl alcohol (PVA), amidizole, and water ($H_2O$); or citric acid, polyvinyl alcohol (PVA), triethanolamine, and water ($H_2O$).

In addition, a water rinse may be performed after each of the above steps a, b, c, d, and e. In an alternative embodiment of the present invention, an additional cleaning step may be performed after the step c for forming the activation layer 326 and before the step d. However, such a cleaning step may reduce the catalytic activity of the activation layer 326. In that case, the additional cleaning step after the step c and before the step d is not performed.

Figure 44:
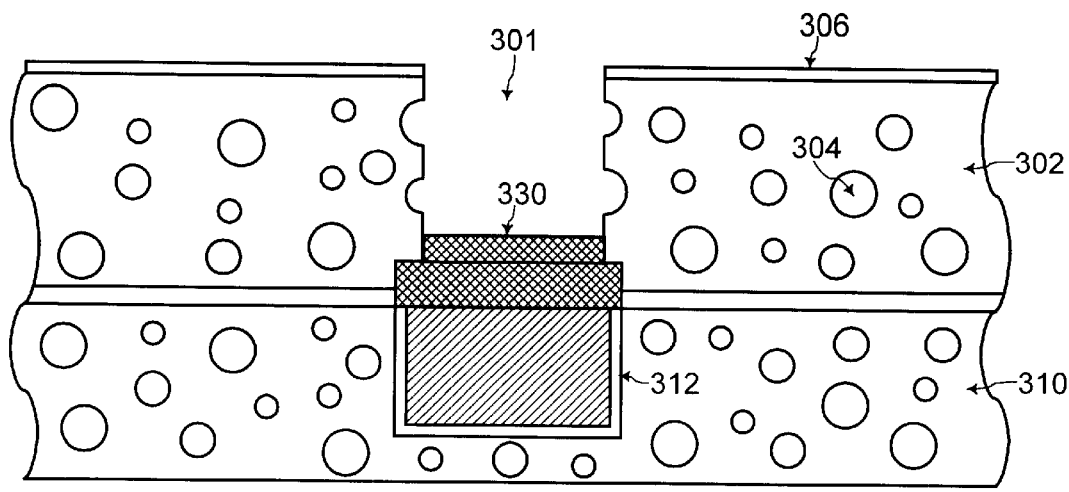
FIGS. 44 and 45 show cross-sectional views illustrating formation of an additional amount of the diffusion barrier material at the bottom wall of the interconnect opening, for the diffusion barrier material already formed on a lower interconnect structure before the interconnect opening is formed, for increasing the thickness of the diffusion barrier material sputtered onto the sidewalls of the interconnect opening, according to another embodiment of the present invention.

Referring to FIGS. 33 and 44, in another embodiment of the present invention, when the interconnect opening 301 is formed after deposition of the diffusion barrier material 318, an additional amount of the diffusion barrier material 330 is further deposited at the bottom wall of the interconnect opening 301 after formation of the interconnect opening 301. The additional amount of the diffusion barrier material 330 may be selectively formed on the diffusion barrier material 318 at the bottom wall of the interconnect opening 301 in an electroless deposition process similarly as already described herein for forming the diffusion barrier material 318.

Figure 45:
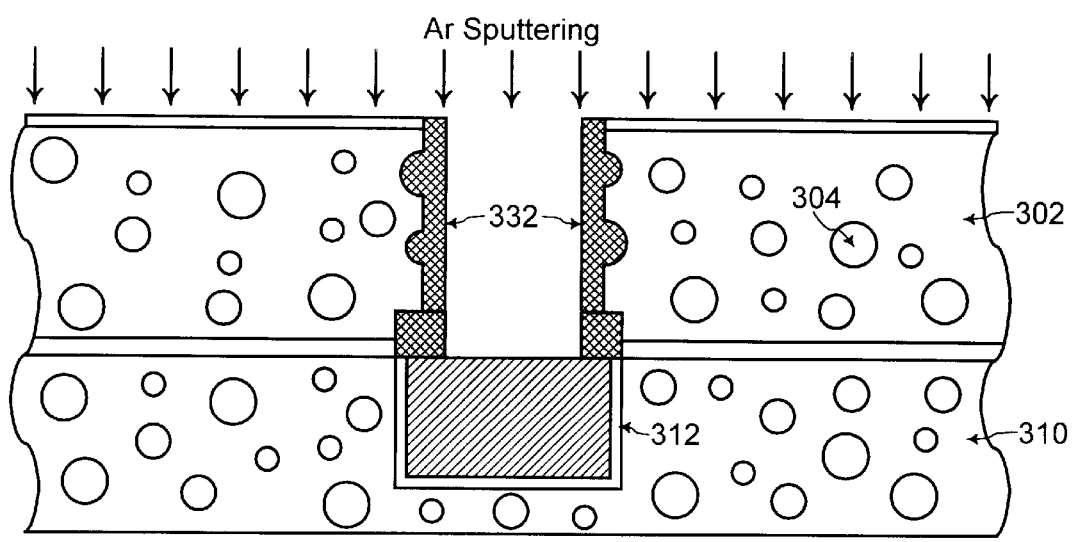

Referring to FIGS. 44 and 45, the additional amount of the diffusion barrier material 330 and the initial diffusion barrier material 318 are sputtered away from the bottom wall of the interconnect opening onto the sidewalls of the interconnect opening 301. Thus, diffusion barrier material 332 sputtered onto the sidewalls of the interconnect opening 301 in FIG. 45 with the additional amount of the diffusion barrier material 330 is thicker than without the additional amount of the diffusion barrier material 330.

In this manner, because the interconnect opening 301 is filled with the conductive fill material 322 after the opened pores 316 at the sidewalls of the interconnect opening 301 are filled with the diffusion barrier material 318, void formation from the opened pores 316 are minimized to in turn minimize electromigration failure of the interconnect structure formed in the interconnect opening 301. The foregoing is by way of example only and is not intended to be limiting. For example, the embodiments of the present invention related to FIGS. 20–45 are described for a via structure formed within a via hole formed on the bottom interconnect structure 308. However, the present invention may be practiced by sputtering diffusion barrier material formed at the bottom wall of other types of interconnect openings such as metal lines or dual damascene openings, as would be apparent to one of ordinary skill in the art of integrated circuit fabrication from the description herein. With electroless deposition for forming the diffusion barrier materials 318 or 330, the present invention may be applied for interconnect structures formed within such interconnect openings having a scaled down width dimension as small as hundreds or tens of nanometers.

Additionally, the present invention is described for formation of copper interconnect structures. However, the present invention may be practiced for minimizing electromigration failure and degradation of interconnect structures with other types of conductive fill, as would be apparent to one of ordinary skill in the art of integrated circuit fabrication from the description herein. In addition, formation of a metal line, a via hole, and a dual damascene opening are illustrated. However, the present invention may be practiced with other types of interconnect openings, as would be apparent to one of ordinary skill in the art of integrated circuit fabrication from the description herein. More specifically, the present invention may be practiced with the metal line, the via hole, and the dual damascene opening formed with different layers of material surrounding such openings, as would be apparent to one of ordinary skill in the art of integrated circuit fabrication from the description herein. Any material described herein is by way of example only.

Additionally, as will be understood by those skilled in the art, the structures described herein may be made or used in the same way regardless of their position and orientation. Accordingly, it is to be understood that terms and phrases such as "on," "top," "bottom," and "side" as used herein refer to relative location and orientation of various portions of the structures with respect to one another, and are not intended to suggest that any particular absolute orientation with respect to external objects is necessary or required. The present invention is limited only as defined in the following claims and equivalents thereof.

We claim:

1. A method for fabricating an interconnect structure within an interconnect opening formed within a porous dielectric material, the method comprising the steps of:
   A. forming said interconnect opening within a low-K precursor material that is not completely cured;
   B. filling said interconnect opening with a conductive fill material being contained within said interconnect opening and with a top surface of said conductive fill material within said interconnect opening being exposed;
   C. forming a capping material on said top surface of said conductive fill material, wherein said capping material is an amorphous alloy or is a microcrystalline alloy having stuffed grain boundaries; and
   D. performing a thermal curing process for curing said low-K precursor material to become a porous low-K dielectric material after said steps B and C;
   wherein said capping material on said top surface of said conductive fill material is impervious to at least one of oxygen, carbon, hydrogen, chlorine, and porogen fragments that are generated as out-gassing volatile by-products from said low-K precursor material during said thermal curing process of said step D.

2. The method of claim 1, wherein said step A includes the steps of:
   forming a diffusion barrier material at said sidewalls of said interconnect opening formed in said low-K precursor material that is not completely cured;
   filling said interconnect opening with said conductive fill material after forming said diffusion barrier material at said sidewalls; and
   polishing away any of said conductive fill material and said diffusion barrier material from any dielectric surface surrounding said interconnect opening such that said conductive fill material and said diffusion barrier material are contained within said interconnect opening,
   wherein said capping material is selectively formed on any exposed surface of said conductive fill material and said diffusion barrier material after said step of polishing.

3. The method of claim 2, further including the step of:
   performing a post polish cleaning process by applying a rotating brush to scrub any dielectric surface surrounding said interconnect opening and then applying a cleaning solution on said dielectric surface surrounding said interconnect opening to clean away copper containing particles from said dielectric surface surrounding said interconnect opening, after said step of polishing.

4. The method of claim 3, wherein said cleaning solution is comprised of citric acid, 5-aminotetrazol, and water ($H_2O$); or is comprised of citric acid, benzotriazole (BTA), and water ($H_2O$); or is comprised of citric acid, polyvinyl alcohol (PVA), amidizole, and water ($H_2O$); or is comprised of citric acid, polyvinyl alcohol (PVA), triethanolamine, and water ($H_2O$).

5. The method of claim 1, further including the step of:
   forming a hard-mask material on top of said low-K precursor material before forming said interconnect opening through said hard-mask material and within said low-K precursor material, wherein said hard-mask material on top of said low-K precursor material is transparent to said porogen fragments that are generated as out-gassing volatile by-products during said thermal curing process of said step D.

6. The method of claim 5, wherein said hard-mask material on top of said low-K precursor material is comprised of alkoxysilane.

7. The method of claim 1, wherein said conductive fill material is comprised of copper, and wherein said step C includes the step of:

forming said capping material that is a ternary alloy comprised of cobalt; and one of W (tungsten), Mo (molybdenum), or Re(rhenium); and one of P (phosphorous) or B (boron), wherein said capping material that is said ternary alloy is selectively formed on said conductive fill material during an electroless deposition process.

8. The method of claim 7, further including the step of:

performing a cleaning process by applying a rotating brush to scrub any dielectric surface surrounding said interconnect opening and then applying a cleaning solution on said dielectric surface surrounding said interconnect opening to clean away copper containing particles from said dielectric surface surrounding said interconnect opening, after forming said capping material.

9. The method of claim 8, wherein said cleaning solution is comprised of citric acid, 5-aminotetrazol, and water ($H_2O$); or is comprised of citric acid, benzotriazole (BTA), and water ($H_2O$); or is comprised of citric acid, polyvinyl alcohol (PVA), amidizole, and water ($H_2O$); or is comprised of citric acid, polyvinyl alcohol (PVA), triethanolamine, and water ($H_2O$).

10. The method of claim 7, wherein said capping material is formed in said electroless deposition process with an electrolyte comprised of:

from about 10 grams/liter to about 40 grams/liter of $CoSO_4$ (cobalt sulfate) as a cobalt source;

from about 0.05 grams/liter to about 30 grams/liter of ammonium tungstate or tetramethyl ammonium tungstate as a tungsten source for forming CoWP or CoWB as said capping material, or from about 0.05 grams/liter to about 30 grams/liter of ammonium molybdenate or tetramethyl ammonium molybdenate as a molybdenum source for forming CoMoP or CoMoB as said capping material, or from about 0.05 grams/liter to about 30 grams/liter of ammonium rhenate or tetramethyl ammonium rhenate as a rhenium source for forming CoReP or CoReB as said capping material;

from about 60 grams/liter to about 90 grams/liter of ammonium citrate or tetramethyl ammonium citrate as a complexing agent;

from about 40 grams/liter to about 80 grams/liter of ammonium hydroxide or tetramethyl ammonium hydroxide as a pH adjuster for adjusting the pH of said electroless deposition electrolyte to be in a range of from about 6.5 to about 14;

from about 10 grams/liter to about 40 grams/liter of ammonium hypophosphite for a phosphorus source as a reducing agent for forming CoWP, CoMoP, or CoReP as said capping material, or from about 10 grams/liter to about 40 grams/liter of borane dimethylamine for a boron source as a reducing agent for forming CoWB, CoMoB, or CoReB as said capping material;

water ($H_2O$); and from about 0.01 grams/liter to about 0.02 grams/liter total of at least one of a surfactant and a stabilizer.

11. The method of claim 10, wherein said surfactant is comprised of RE610, and wherein said stabilizer is comprised of 2,2'-dipyridyl.

12. The method of claim 10, wherein said electrolyte for said electroless deposition process during formation of said capping material is at a temperature of from about 55° Celsius to about 92° Celsius.

13. The method of claim 10, wherein said capping material is comprised of CoWP (cobalt tungsten phosphide) with a phosphorous content of about 7–12 atomic percent and with a tungsten content of about 2–4 atomic percent.

14. The method of claim 13, wherein said step C includes the steps of:

wetting said top surface of said conductive fill material in $H_2O$ or $H_2O$ with surfactant;

etching away copper oxides ($Cu_2O$ or CuO) from said top surface of said conductive fill material using one of hydrochloric acid ($H_2O$ with HCl) or sulfuric acid ($H_2O$ with $H_2SO_4$);

rinsing said top surface of said conductive fill material in $H_2O$;

forming said capping material that is comprised of CoWP (cobalt tungsten phosphide) with said electrolyte for said electroless deposition process at a temperature of from about 60° Celsius to about 85° Celsius for a time period of from about 0.5 minutes to about 2 minutes for forming said capping material having a thickness of from about 100 Å (angstroms) to about 500 Å (angstroms);

rinsing said capping material formed on said conductive fill material in $H_2O$; and drying said capping material formed on said conductive fill material in a nitrogen gas ($N_2$) flow.

15. The method of claim 7, further including the step of:

forming an activation layer comprised of one of Pd (palladium), Ag (silver), Co (cobalt), Ni (nickel), Zn (zinc), Pt (platinum), or Sn (tin) on said surface of said conductive fill material before formation of said capping material on said activation layer.

16. The method of claim 15, wherein said activation layer is comprised of Pd (palladium) having a thickness of from about 10 Å (angstroms) to about 50 Å (angstroms) formed in an activation solution comprised of 0.1–2 milli-liter/liter of $PdCl_2$ (palladium chloride), 2–5 milli-liter/liter of HF (hydrofluoric acid), 1–5 milli-liter/liter of $HNO_3$ (nitric acid), 1–30 milli-liter/liter of HCl (hydrochloric acid), and water ($H_2O$).

17. The method of claim 15, further including the step of:

performing a thermal anneal process at a temperature in a range of from about 150° Celsius to about 350° Celsius such that said activation layer forms an adhesion layer between said conductive fill material and said capping material.

18. The method of claim 15, wherein said capping material is formed in said electroless deposition process with an electrolyte comprised of:

from about 10 grams/liter to about 40 grams/liter of $CoSO_4$ (cobalt sulfate) as a cobalt source;

from about 0.05 grams/liter to about 30 grams/liter of ammonium tungstate or tetramethyl ammonium tungstate as a tungsten source for forming CoWP or CoWB as said capping material, or from about 0.05 grams/liter to about 30 grams/liter of ammonium molybdenate or tetramethyl ammonium molybdenate as a molybdenum source for forming CoMoP or CoMoB as said capping material, or from about 0.05 grams/liter to about 30 grams/liter of ammonium rhenate or tetramethyl ammonium rhenate as a rhenium source for forming CoReP or CoReB as said capping material;

from about 60 grams/liter to about 90 grams/liter of ammonium citrate or tetramethyl ammonium citrate as a complexing agent;

from about 40 grams/liter to about 80 grams/liter of ammonium hydroxide or tetramethyl ammonium hydroxide as a pH adjuster for adjusting the pH of said electroless deposition electrolyte to be in a range of from about 6.5 to about 14;

from about 10 grams/liter to about 40 grams/liter of ammonium hypophosphite for a phosphorus source as a reducing agent for forming CoWP, CoMoP, or CoReP as said capping material, or from about 10 grams/liter to about 40 grams/liter of borane dimethylamine for a boron source as a reducing agent for forming CoWB, CoMoB, or CoReB as said capping material;

water ($H_2O$); and from about 0.01 grams/liter to about 0.02 grams/liter total of at least one of a surfactant and a stabilizer;

wherein said electrolyte for said electroless deposition process during formation of said capping material is at a temperature of from about 55° Celsius to about 65° Celsius.

19. The method of claim 15, further including the step of:
performing a cleaning process by applying a rotating brush to scrub any dielectric surface surrounding said interconnect opening and then applying a cleaning solution on said dielectric surface surrounding said interconnect opening to clean away copper containing particles from said dielectric surface surrounding said interconnect opening, after forming said activation layer.

20. The method of claim 19, wherein said cleaning solution is comprised of citric acid, 5-aminotetrazol, and water ($H_2O$); or is comprised of citric acid, benzotriazole (BTA), and water ($H_2O$); or is comprised of citric acid, polyvinyl alcohol (PVA), amidizole, and water ($H_2O$); or is comprised of citric acid, polyvinyl alcohol (PVA), triethanolamine, and water ($H_2O$).

21. The method of claim 1, wherein said interconnect opening is one of a metal line, a via hole, or a dual damascene opening, having a width dimension of hundreds or tens of nanometers.

22. A method for fabricating an interconnect structure within an interconnect opening formed within a dielectric material, the method comprising the steps of:
A. forming said interconnect opening within said dielectric material comprised of silicon dioxide ($SiO_2$) formed from TEOS (tetraethoxysilane) or from FTEOS (fluorine-doped tetraethoxysilane);
B. filling said interconnect opening with a conductive fill material being contained within said interconnect opening and with a top surface of said conductive fill material within said interconnect opening being exposed; and
C. forming a capping material on said top surface of said conductive fill material, wherein said capping material is an amorphous alloy or is a microcrystalline alloy having stuffed grain boundaries;
wherein said capping material comprised of said amorphous alloy or said microcrystalline alloy having stuffed grain boundaries minimizes electromigration failure of said interconnect structure.

23. The method of claim 22 wherein said step A includes the steps of:
forming a diffusion barrier material at said sidewalls of said interconnect opening before filling said interconnect opening with said conductive fill material; and
polishing away any of said conductive fill material and said diffusion barrier material from any dielectric surface surrounding said interconnect opening such that said conductive fill material and said diffusion barrier material are contained within said interconnect opening,
wherein said capping material is selectively formed on any exposed surface of said conductive fill material and said diffusion barrier material after said step of polishing.

24. The method of claim 23 further including the step of:
performing a post polish cleaning process by applying a rotating brush to scrub any dielectric surface surrounding said interconnect opening and then applying a cleaning solution on said dielectric surface surrounding said interconnect opening to clean away copper containing particles from said dielectric surface surrounding said interconnect opening, after said step of polishing.

25. The method of claim 24, wherein said cleaning solution is comprised of citric acid, 5-aminotetrazol, and water ($H_2O$); or is comprised of citric acid, benzotriazole (BTA), and water ($H_2O$); or is comprised of citric acid, polyvinyl alcohol (PVA), amidizole, and water ($H_2O$); or is comprised of citric acid, polyvinyl alcohol (PVA), triethanolamine, and water ($H_2O$).

26. The method of claim 22, further including the step of:
forming a hard-mask material on top of said dielectric material comprised of silicon dioxide ($SiO_2$) formed from TEOS (tetraethoxysilane) or from FTEOS (fluorine-doped tetraethoxysilane) before forming said interconnect opening through said hard-mask material and within said dielectric material.

27. The method of claim 22 wherein said conductive fill material is comprised of copper, and wherein said step C includes the step of:
forming said capping material that is a ternary alloy comprised of cobalt; and one of W (tungsten), Mo (molybdenum), or Re(rhenium); and one of P (phosphorous) or B (boron),
wherein said capping material that is said ternary alloy is selectively formed on said conductive fill material during an electroless deposition process.

28. The method of claim 27 further including the step of:
performing a cleaning process by applying a rotating brush to scrub any dielectric surface surrounding said interconnect opening and then applying a cleaning solution on said dielectric surface surrounding said interconnect opening to clean away copper containing particles from said dielectric surface surrounding said interconnect opening, after forming said capping material.

29. The method of claim 28 wherein said cleaning solution is comprised of citric acid, 5-aminotetrazol, and water ($H_2O$); or is comprised of citric acid, benzotriazole (BTA), and water ($H_2O$); or is comprised of citric acid, polyvinyl alcohol (PVA), amidizole, and water ($H_2O$); or is comprised of citric acid, polyvinyl alcohol (PVA), triethanolamine, and water ($H_2O$).

30. The method of claim 27, wherein said capping material is formed in said electroless deposition process with an electrolyte comprised of:

from about 10 grams/liter to about 40 grams/liter of $CoSO_4$ (cobalt sulfate) as a cobalt source;

from about 0.05 grams/liter to about 30 grams/liter of ammonium tungstate or tetramethyl ammonium tungstate as a tungsten source for forming CoWP or COWB as said capping material, or from about 0.05 grams/liter to about 30 grams/liter of ammonium molybdenate or tetramethyl ammonium molybdenate as a molybdenum source for forming CoMoP or CoMoB as said capping material, or from about 0.05 grams/liter to about 30 grams/liter of ammonium rhenate or tetramethyl ammonium rhenate as a rhenium source for forming CoReP or CoReB as said capping material;

from about 60 grams/liter to about 90 grams/liter of ammonium citrate or tetramethyl ammonium citrate as a complexing agent;

from about 40 grams/liter to about 80 grams/liter of ammonium hydroxide or tetramethyl ammonium hydroxide as a pH adjuster for adjusting the pH of said electroless deposition electrolyte to be in a range of from about 6.5 to about 14;

from about 10 grams/liter to about 40 grams/liter of ammonium hypophosphite for a phosphorus source as a reducing agent for forming CoWP, CoMoP, or CoReP as said capping material, or from about 10 grams/liter to about 40 grams/liter of borane dimethylamine for a boron source as a reducing agent for forming CoWB, CoMoB, or CoReB as said capping material;

water ($H_2O$); and from about 0.01 grams/liter to about 0.02 grams/liter total of at least one of a surfactant and a stabilizer.

31. The method of claim 30, wherein said surfactant is comprised of RE610, and wherein said stabilizer is comprised of 2,2'-dipyridyl.

32. The method of claim 30, wherein said electrolyte for said electroless deposition process during formation of said capping material is at a temperature of from about 55° Celsius to about 92° Celsius.

33. The method of claim 30, wherein said capping material is comprised of CoWP (cobalt tungsten phosphide) with a phosphorous content of about 7–12 atomic percent and with a tungsten content of about 2–4 atomic percent.

34. The method of claim 33, wherein said step C includes the steps of:

wetting said top surface of said conductive fill material in $H_2O$ or $H_2O$ with surfactant;

etching away copper oxides ($Cu_2O$ or $CuO$) from said top surface of said conductive fill material using one of hydrochloric acid ($H_2O$ with HCl) or sulfuric acid ($H_2O$ with $H_2SO_4$);

rinsing said top surface of said conductive fill material in $H_2O$;

forming said capping material that is comprised of CoWP (cobalt tungsten phosphide) with said electrolyte for said electroless deposition process at a temperature of from about 60° Celsius to about 85° Celsius for a time period of from about 0.5 minutes to about 2 minutes for forming said capping material having a thickness of from about 100 Å (angstroms) to about 500 Å (angstroms);

rinsing said capping material formed on said conductive fill material in $H_2O$; and drying said capping material formed on said conductive fill material in a nitrogen gas ($N_2$) flow.

35. The method of claim 27, further including the step of:

forming an activation layer comprised of one of Pd (palladium), Ag (silver), Co (cobalt), Ni (nickel), Zn (zinc), Pt (platinum), or Sn (tin) on said surface of said conductive fill material before formation of said capping material on said activation layer.

36. The method of claim 35, wherein said activation layer is comprised of Pd (palladium) having a thickness of from about 10 Å (angstroms) to about 50 Å (angstroms) formed in an activation solution comprised of 0.1–2 milli-liter/liter of $PdCl_2$ (palladium chloride), 2–5 milli-liter/liter of HF (hydrofluoric acid), 1–5 milli-liter/liter of $HNO_3$ (nitric acid), 1–30 milli-liter/liter of HCl (hydrochloric acid), and water ($H_2O$).

37. The method of claim 35 further including the step of:

performing a thermal anneal process at a temperature in a range of from about 150° Celsius to about 350° Celsius such that said activation layer forms an adhesion layer between said conductive fill material and said capping material.

38. The method of claim 35, wherein said capping material is formed in said electroless deposition process with an electrolyte comprised of:

from about 10 grams/liter to about 40 grams/liter of $CoSO_4$ (cobalt sulfate) as a cobalt source;

from about 0.05 grams/liter to about 30 grams/liter of ammonium tungstate or tetramethyl ammonium tungstate as a tungsten source for forming CoWP or CoWB as said capping material, or from about 0.05 grams/liter to about 30 grams/liter of ammonium molybdenate or tetramethyl ammonium molybdenate as a molybdenum source for forming CoMoP or CoMoB as said capping material, or from about 0.05 grams/liter to about 30 grams/liter of ammonium rhenate or tetramethyl ammonium rhenate as a rhenium source for forming CoReP or CoReB as said capping material;

from about 60 grams/liter to about 90 grams/liter of ammonium citrate or tetramethyl ammonium citrate as a complexing agent;

from about 40 grams/liter to about 80 grams/liter of ammonium hydroxide or tetramethyl ammonium hydroxide as a pH adjuster for adjusting the pH of said electroless deposition electrolyte to be in a range of from about 6.5 to about 14;

from about 10 grams/liter to about 40 grams/liter of ammonium hypophosphite for a phosphorus source as a reducing agent for forming CoWP, CoMoP, or CoReP as said capping material, or from about 10 grams/liter to about 40 grams/liter of borane dimethylamine for a boron source as a reducing agent for forming CoWB, CoMoB, or CoReB as said capping material;

water ($H_2O$); and from about 0.01 grams/liter to about 0.02 grams/liter total of at least one of a surfactant and a stabilizer;

wherein said electrolyte for said electroless deposition process during formation of said capping material is at a temperature of from about 55° Celsius to about 65° Celsius.

39. The method of claim 35, further including the step of:

performing a cleaning process by applying a rotating brush to scrub any dielectric surface surrounding said interconnect opening and then applying a cleaning solution on said dielectric surface surrounding said interconnect opening to clean away copper containing particles from said dielectric surface surrounding said interconnect opening, after forming said activation layer.

40. The method of claim 39, wherein said cleaning solution is comprised of citric acid, 5-aminotetrazol, and water ($H_2O$); or is comprised of citric acid, benzotriazole (BTA), and water ($H_2O$); or is comprised of citric acid, polyvinyl alcohol (PVA), amidizole, and water ($H_2O$); or is comprised of citric acid, polyvinyl alcohol (PVA), triethanolamine, and water ($H_2O$).

41. The method of claim 22, wherein said interconnect opening is one of a metal line, a via hole, or a dual damascene opening, having a width dimension of hundreds or tens of nanometers.

42. A method for fabricating an interconnect structure, the method comprising the steps of:
  A. forming an interconnect opening within a porous dielectric material with opened pores at sidewalls of said interconnect opening;
  B. forming a diffusion barrier material at a bottom wall of said interconnect opening; and
  C. sputtering said diffusion barrier material away from said bottom wall of said interconnect opening and onto said sidewalls of said interconnect opening to substantially fill said opened pores at said sidewalls with said diffusion barrier material.

43. The method of claim 42 wherein said step B includes the step of depositing said diffusion barrier material onto said bottom wall of said interconnect opening after said interconnect opening is formed in said step A.

44. The method of claim 42 wherein said steps A and B include the steps of depositing said diffusion barrier material onto a conductive material of a bottom interconnect structure and then forming said porous dielectric material and said interconnect opening over said diffusion barrier material such that said diffusion barrier material forms said bottom wall of said interconnect opening.

45. The method of claim 44, wherein said step B further includes the step of:
  depositing an additional amount of diffusion barrier material on said bottom wall of said interconnect opening after forming said interconnect opening.

46. The method of claim 42, wherein said diffusion barrier material is comprised of one of CoWP (cobalt tungsten phosphide), CoWB (cobalt tungsten boride), CoMoP (cobalt molybdenum phosphide), CoMoB (cobalt molybdenum boride), CoReP (cobalt rhenium phosphide), or CoReB (cobalt rhenium boride), formed in an electroless deposition process.

47. The method of claim 46, wherein said diffusion barrier material is formed in said electroless deposition process with an electroless deposition electrolyte comprised of:
  from about 10 grams/liter to about 40 grams/liter of $CoSO_4$ (cobalt sulfate) as a cobalt source;
  from about 5 grams/liter to about 20 grams/liter of ammonium tungstate or tetramethyl ammonium tungstate as a tungsten source for forming CoWP or CoWB as said diffusion barrier material, or from about 5 grams/liter to about 20 grams/liter of ammonium molybdenate or tetramethyl ammonium molybdenate as a molybdenum source for forming CoMoP or CoMoB as said diffusion barrier material, or from about 5 grams/liter to about 20 grams/liter of ammonium rhenate or tetramethyl ammonium rhenate as a rhenium source for forming CoReP or CoReB as said diffusion barrier material;
  from about 70 grams/liter to about 90 grams/liter of ammonium citrate or tetramethyl ammonium citrate as a complexing agent;
  from about 5 grams/liter to about 50 grams/liter of ammonium chloride or tetramethyl ammonium chloride;
  from about 5 grams/liter to about 15 grams/liter of ammonium hypophosphite for a phosphorus source as a reducing agent for forming CoWP, CoMoP, or CoReP as said diffusion barrier material, or from about 5 grams/liter to about 20 grams/liter of borane dimethylamine for a boron source as a reducing agent for forming CoWB, CoMoB, or CoReB as said diffusion barrier material;
  water ($H_2O$); and
  from about 0.01 grams/liter to about 0.1 grams/liter of a surfactant.

48. The method of claim 42, further including the step of:
  forming an activation layer on said bottom wall of said interconnect opening before forming said diffusion barrier material on said activation layer.

49. The method of claim 48, wherein said activation layer is comprised of one of Pd (palladium), Ag (silver), Co (cobalt), Ni (nickel), Zn (zinc), Sn (tin), or Au (gold).

50. The method of claim 49, wherein said activation layer is comprised of Pd (palladium) formed in an activation solution comprised of 0.1–2 milli-liter/liter of $PdCl_2$ (palladium chloride), 2–5 milli-liter/liter of HF (hydrofluoric acid), 1–5 milli-liter/liter of $HNO_3$ (nitric acid), 1–30 milli-liter/liter of HCl (hydrochloric acid), and water ($H_2O$), and wherein said step of forming said activation layer includes the step of applying surfactant and water ($H_2O$) on said bottom wall of said interconnect opening before formation of said activation layer on said bottom wall.

51. The method of claim 48 further including the step of:
  cleaning exposed surfaces of any dielectric material and said bottom wall of said interconnect opening with citric acid, sulfuric acid, hydrochloric acid, and water ($H_2O$) before formation of said activation layer.

52. The method of claim 48, further including the step of:
  sputtering further down said activation layer away from said bottom wall of said interconnect opening onto said diffusion barrier material on said sidewalls of said interconnect opening.

53. The method of claim 52, further including the step of:
  filling said interconnect opening with a conductive fill material after sputtering said activation layer onto said sidewalls of said interconnect opening.

54. The method of claim 52 wherein said bottom wall of said interconnect opening before deposition of said activation layer is comprised of a conductive material, and wherein the method further includes the step of:
  sputtering further down said conductive material away from said bottom wall of said interconnect opening onto said activation layer on said sidewalls of said interconnect opening.

55. The method of claim 54, further including the step of:
  filling said interconnect opening with a conductive fill material after sputtering said conductive material onto said sidewalls of said interconnect opening.

56. The method of claim 42, further including the step of:
  filling said interconnect opening with a conductive fill material after sputtering said diffusion barrier onto said sidewalls of said interconnect opening.

57. The method of claim 56, further including the steps of:
  depositing an additional diffusion barrier material onto said sidewalls of said interconnect opening after said step C and before said step of filling said interconnect opening with said conductive fill material.

58. The method of claim 57, wherein said additional diffusion barrier material is comprised of one of WN (tungsten nitride), TaN (tantalum nitride), or TiSiN (titanium silicon nitride) deposited in one of a CVD (chemical vapor deposition) process or an ALD (atomic layer deposition) process.

59. The method of claim 56, wherein said diffusion barrier material is completely sputtered away from said bottom wall of said interconnect opening such that substantially none of said diffusion barrier material is at said bottom wall of said interconnect opening before said step of filling said interconnect opening with said conductive fill material.

60. The method of claim 56, wherein said conductive fill material is comprised of copper deposited to fill said interconnect opening in an electroless deposition process.

61. The method of claim 60, wherein said copper conductive fill material is deposited in said electroless deposition process with an electroless deposition electrolyte comprised of:
   from about 4 grams/liter to about 10 grams/liter of $CuSO_4$ (copper sulfate) as a copper source;
   from about 10 grams/liter to about 20 grams/liter of EDTA (ethylene diamine tetra acetic acid) as a complexing agent;
   from about 15 grams/liter to about 30 grams/liter of tetramethyl ammonium hydroxide as a pH adjuster;
   from about 1 grams/liter to about 5 grams/liter of glyoxylic acid as a reducing agent;
   water ($H_2O$); and
   from about 0.01 grams/liter to about 0.1 grams/liter total of RE610 as a surfactant, 2,2'-dipyridyl as a stabilizer, and Triton as a wetting agent.

62. The method of claim 42, further including the step of:
   depositing a layer of hard-mask dielectric material on said porous dielectric material before forming said interconnect opening through said layer of hard-mask dielectric material and said porous dielectric material.

63. The method of claim 42, further including the step of:
   cleaning exposed surfaces of any dielectric material and said bottom wall of said interconnect opening with citric acid, sulfuric acid, hydrochloric acid, and water ($H_2O$) before formation of said diffusion barrier material at said bottom wall of said interconnect opening.

64. The method of claim 42, wherein said step C is performed in an argon sputtering process with a base pressure of $2-5\times10^{-7}$ torr, with an argon gas pressure of $5-15\times10^{-3}$ torr, with an argon gas flow rate of 35–45 sccm (standard cubic centimeters per minute), for a time period of 1–30 seconds for sputtering said diffusion barrier material having a thickness of about 1–30 nanometers at said bottom wall of said interconnect opening.

65. The method of claim 42, wherein said step C is performed in an argon sputtering process with a base pressure of $2-5\times10^{-7}$ torr, with an argon and nitrogen (Ar and $N_2$) gas pressure of $1-5\times10^{-3}$ torr, with an argon gas flow rate of 15–25 sccm (standard cubic centimeters per minute), with a nitrogen ($N_2$) gas flow rate of 5–15 sccm (standard cubic centimeters per minute), for a time period of 1–60 seconds for sputtering said diffusion barrier material having a thickness of about 1–30 nanometers at said bottom wall of said interconnect opening.

66. The method of claim 42 wherein said interconnect opening is one of a metal line, a via hole, or a dual damascene opening having a width dimension of hundreds or tens of nanometers.

67. A method for fabricating an interconnect structure, the method comprising the steps of:
   A. forming a layer of porous dielectric material and a layer of hard-mask dielectric material on said layer of porous dielectric material;
   B. forming an interconnect opening through said layer of hard-mask dielectric material and said porous dielectric material with opened pores at sidewalls of said interconnect opening, wherein said interconnect opening is one of a metal line, a via hole, or a dual damascene opening having a width dimension of hundreds or tens of nanometers;
   C. cleaning exposed surfaces of any dielectric material and said bottom wall of said interconnect opening with citric acid, sulfuric acid, hydrochloric acid, and water ($H_2O$);
   D. applying surfactant and water ($H_2O$) on said bottom wall of said interconnect opening and forming an activation layer on said bottom wall of said interconnect opening, wherein said activation layer is comprised of Pd (palladium) formed in an activation solution comprised of 0.1–2 milli-liter/liter of $PdCl_2$ (palladium chloride), 2–5 milli-liter/liter of HF (hydrofluoric acid), 1–5 milli-liter/liter of $HNO_3$ (nitric acid), 1–30 milli-liter/liter of HCl (hydrochloric acid), and water ($H_2O$);
   E. forming a diffusion barrier material at a bottom wall of said interconnect opening, wherein said diffusion barrier material is comprised of one of CoWP (cobalt tungsten phosphide), CoWB (cobalt tungsten boride), CoMoP (cobalt molybdenum phosphide), CoMoB (cobalt molybdenum boride), CoReP (cobalt rhenium phosphide), or CoReB (cobalt rhenium boride), formed in an electroless deposition process with an electroless deposition electrolyte comprised of:
      from about 10 grams/liter to about 40 grams/liter of $CoSO_4$ (cobalt sulfate) as a cobalt source;
      from about 5 grams/liter to about 20 grams/liter of ammonium tungstate or tetramethyl ammonium tungstate as a tungsten source for forming CoWP or CoWB as said diffusion barrier material, or from about 5 grams/liter to about 20 grams/liter of ammonium molybdenate or tetramethyl ammonium molybdenate as a molybdenum source for forming CoMoP or CoMoB as said diffusion barrier material, or from about 5 grams/liter to about 20 grams/liter of ammonium rhenate or tetramethyl ammonium rhenate as a rhenium source for forming CoReP or CoReB as said diffusion barrier material;
      from about 70 grams/liter to about 90 grams/liter of ammonium citrate or tetramethyl ammonium citrate as a complexing agent;
      from about 5 grams/liter to about 50 grams/liter of ammonium chloride or tetramethyl ammonium chloride;
      from about 5 grams/liter to about 15 grams/liter of ammonium hypophosphite for a phosphorus source as a reducing agent for forming CoWP, CoMoP, or CoReP as said diffusion barrier material, or from about 5 grams/liter to about 20 grams/liter of borane dimethylamine for a boron source as a reducing agent for forming CoWB, CoMoB, or CoReB as said diffusion barrier material;
      water ($H_2O$); and
      from about 0.01 grams/liter to about 0.1 grams/liter of a surfactant;
   F. sputtering said diffusion barrier material away from said bottom wall of said interconnect opening and onto said sidewalls of said interconnect opening to substantially fill said opened pores at said sidewalls with said diffusion barrier material, wherein the step of sputtering is performed in an argon sputtering process with a base pressure of $2-5\times10^{-7}$ torr, with an argon gas pressure of $5-15\times10^{-3}$ torr, with an argon gas flow rate of 35–45 sccm (standard cubic centimeters per minute), for a time period of 1–30 seconds for sputtering said diffusion barrier material having a thickness of about 1–30 nanometers at said bottom wall of said interconnect opening;

G. depositing an additional diffusion barrier material onto said sidewalls of said interconnect opening, wherein said additional diffusion barrier material is comprised of one of WN (tungsten nitride), TaN (tantalum nitride), or TiSiN (titanium silicon nitride) deposited in one of a CVD (chemical vapor deposition) process or an ALD (atomic layer deposition) process; and H. filling said interconnect opening with a conductive fill material comprised of copper deposited in an electroless deposition process with an electroless deposition electrolyte comprised of:

from about 4 grams/liter to about 10 grams/liter of $CuSO_4$ (copper sulfate) as a copper source;

from about 10 grams/liter to about 20 grams/liter of EDTA (ethylene diamine tetra acetic acid) as a complexing agent;

from about 15 grams/liter to about 30 grams/liter of tetramethyl ammonium hydroxide as a pH adjuster;

from about 1 grams/liter to about 5 grams/liter of glyoxylic acid as a reducing agent;

water ($H_2O$); and from about 0.01 grams/liter to about 0.1 grams/liter total of RE610 as a surfactant, 2,2'-dipyridyl as a stabilizer, and Triton as a wetting agent.

\* \* \* \* \*